(12) United States Patent
Ota et al.

(10) Patent No.: US 6,496,314 B1
(45) Date of Patent: Dec. 17, 2002

(54) RECORDING/PLAYBACK APPARATUS WITH ELECTRIC WAVE TRANSMISSION

(75) Inventors: Shuichi Ota, Saitama; Takashi Katoku, Tokyo; Masayasu Kaneko, Ibaraki, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/713,335

(22) Filed: Nov. 16, 2000

(30) Foreign Application Priority Data

Nov. 17, 1999 (JP) .......................................... 11-327398
Dec. 10, 1999 (JP) .......................................... 11-351087
Dec. 21, 1999 (JP) .......................................... 11-362067

(51) Int. Cl.$^7$ ................................................ G11B 5/02
(52) U.S. Cl. ...................................... 360/55; 360/132
(58) Field of Search .......................... 360/55, 137, 132, 360/133, 93

(56) References Cited

U.S. PATENT DOCUMENTS 6,034,828 A * 3/2000 Hamanaka et al. ......... 360/132
6,124,999 A * 9/2000 Yamamoto ................... 360/69
6,327,633 B1 * 12/2001 Chawla et al. ................ 710/62

\* cited by examiner

Primary Examiner—Alan T. Faber
(74) Attorney, Agent, or Firm—Rader, Fishman & Grauer, PLLC; Ronald P. Kananen, Esquire

(57) ABSTRACT

A recording/playback apparatus accommodates a recording medium in a cassette shell and performs recording and/or playback with respect to the recording medium cassette provided with a cassette-side antenna connected to an in-cassette memory. The playback apparatus includes a recording/playback mechanism, a cassette holding member, a cassette passing member and an apparatus side antenna. The apparatus side antenna effects communication through the in-cassette memory and the cassette-side antenna. An electric wave transmission portion is formed in a portion of the cassette holding member opposed to the cassette-side antenna. The apparatus-side antenna is arranged in correspondence with the electric wave transmission portion.

3 Claims, 33 Drawing Sheets

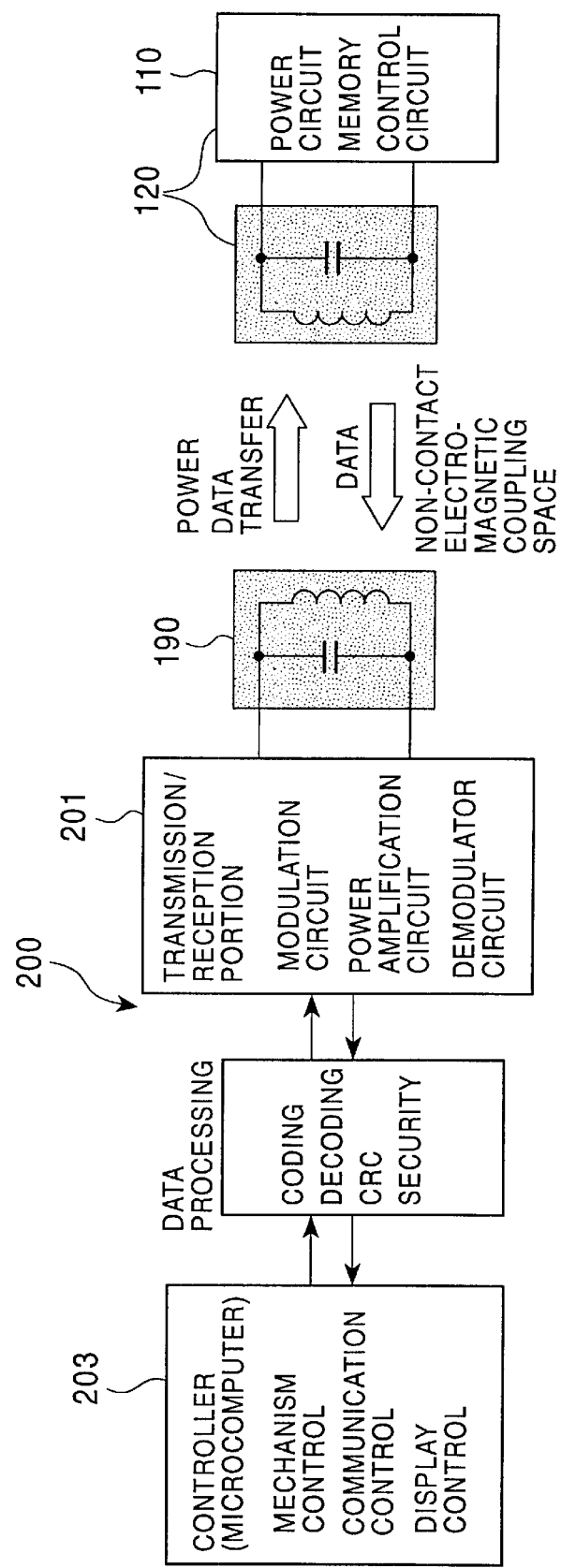

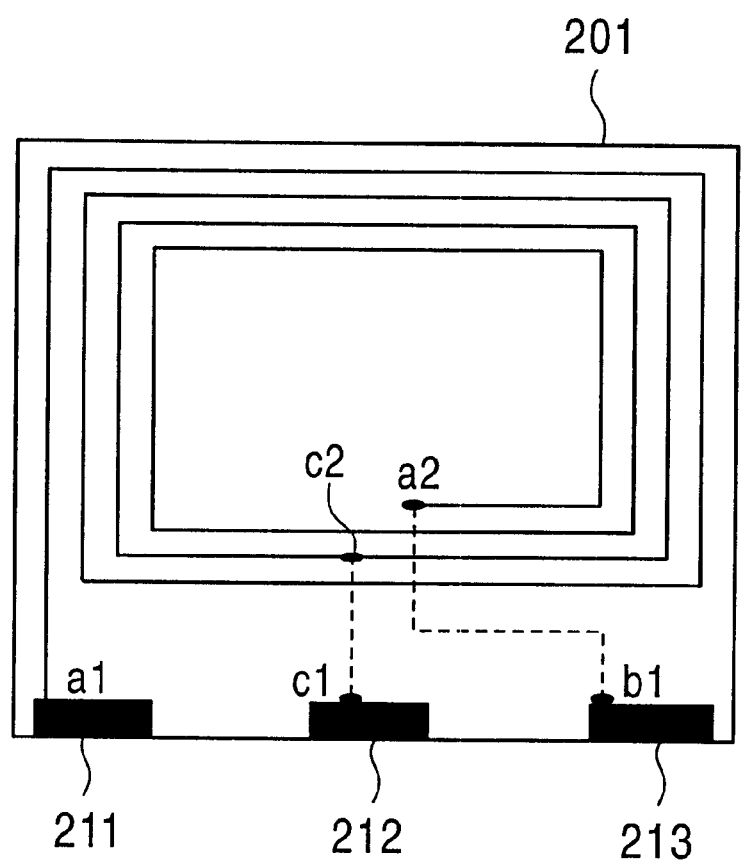

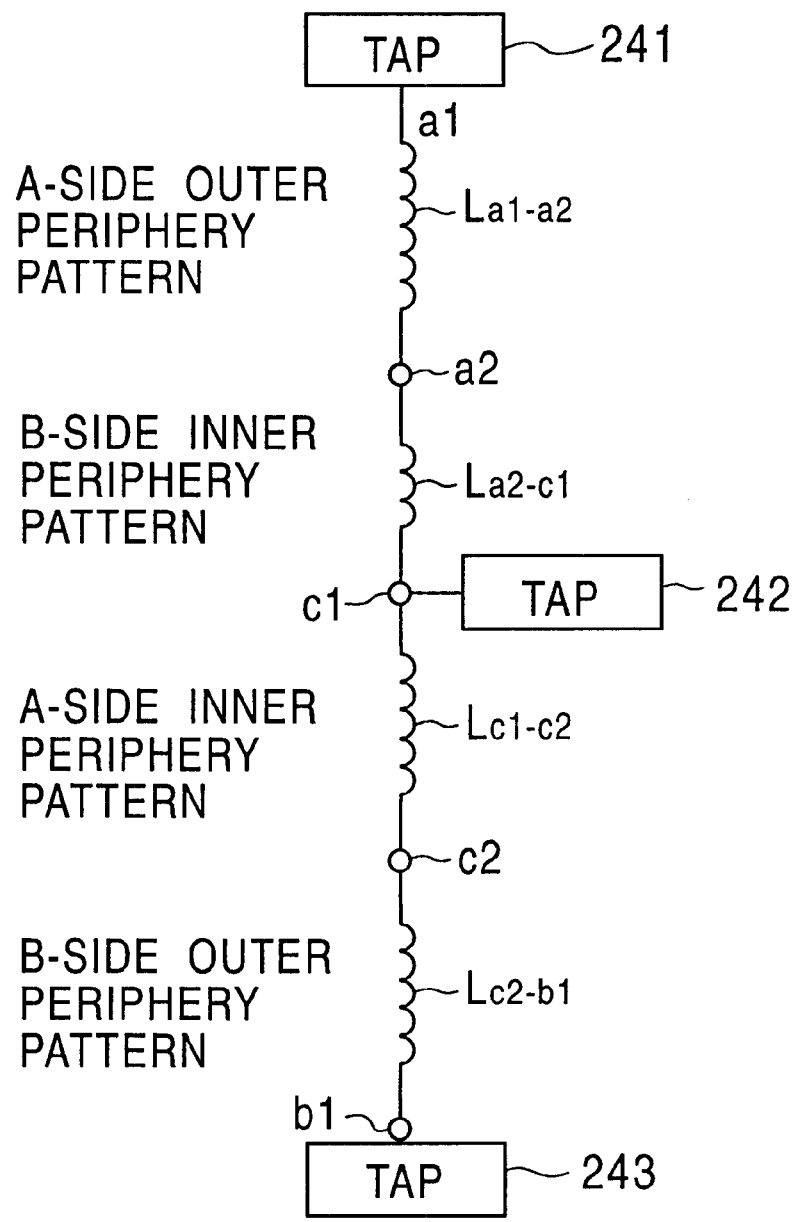

RECORDING/PLAYBACK APPARATUS WITH ELECTRIC WAVE TRANSMISSION

BACKGROUND OF THE INVENTION

1. Field of the Invention

The present invention relates to a recording/playback apparatus.

2. Description of the Related Art

There is a system which is provided with an in-cassette memory for recording information regarding recording contents or the like and a cassette-side antenna and in which access is gained to the in-cassette memory while keeping the recording/playback apparatus side in a non-contact state.

When reducing the size of a recording/playback apparatus, it is necessary, from the viewpoint of strength, to form the cassette holding member, which holds the recording medium cassette and which moves between the recording/playback position where recording and/or playback is effected to and from the recording medium cassette and the cassette passing position where the passing of the recording medium cassette is effected between the interior and the exterior of the apparatus, must be formed of a metal.

FIG. 14 shows an example of a coil pattern formed on a printed circuit board. As shown in FIG. 14, the coil formed on the printed circuit board is realized by spirally developing the pattern on the printed circuit board from a terminal (input terminal) a1 on one side of the coil connected to a tap 211 toward the inner periphery side.

Here, when an attempt is made to connect a terminal (output terminal) b1 on the opposite side of the terminal a1 to a tap 213, it is impossible to lead out the pattern from the side (side A) where the pattern forming the coil is developed (In the same plane, it is impossible for one pattern to jump over the other pattern so that the two patterns may not come into contact with each other), so that it is necessary to lead out the pattern from a terminal a2 of the coil of the side A to the opposite side (side B) through a through-hole, and to form on the side B a pattern indicated by a dashed line, connecting the pattern to the terminal b1 through the through-hole. That is, it is necessary to form the printed circuit board 1 as a two-layer (double-sided) substrate. Further, in this case, by connecting terminals c2 and c1 in the intermediate portion of the coil by utilizing the side B, it is possible to prepare a tap 212.

To keep the substrate area small while improving the inductance of this coil, a spiral pattern is formed on either of the sides A and B of the double-layer substrate as in the case of a printed circuit board 220 shown in FIG. 15 (That is, the number of turns of the coil is increased). However, in the case of FIG. 15, while taps 221 and 22 connected to both ends of the coil can be easily formed, it is impossible, due to the fact that it is a pattern on a substrate, to form an intermediate tap unless air wiring (for example, wiring using a jumper line).

Thus, if an improvement in inductance is to be achieved with a small substrate area, and further, if an intermediate tap is to be provided, another layer is added to form a three-layer structure to form a pattern for the intermediate tap on the printed circuit board, whereby, as in the case of a printed circuit board 230 shown in FIG. 16, it is possible to mount taps 231 through 233 without performing air wiring. In the case of the example shown in FIG. 16, an intermediate terminal a2 is formed between the input terminal a1 connected to the tap 231 and the output terminal b1 connected to the tap 233, and this intermediate terminal a2 is connected to the tap 232 through the terminal c1.

When a coil formed on a substrate is used, for example, in a circuit of an antenna used in radio communication, electromagnetic coupling non-contact communication or the like, the power last step circuit on the transmission side is in many cases formed as a push-pull circuit, and, to supply transmission power to the coil, it is more advantageous that an intermediate tap be formed in the coil. FIG. 17 shows an example of a coil of a transmission apparatus using a coil having no intermediate tap (the printed circuit board 220 described with reference to FIG. 15) in electromagnetic coupling non-contact communication.

Drive signals of normal and reverse phases are emitted by signal sources V1 and V2 in FIG. 17. These signals are increased in power by transistors Q1 and Q2 and resonated at a predetermined communication frequency by a capacitor C3. The values of capacitors C1 and C2 and resistors R1 through R7 are determined by the characteristics of the circuit. The DC voltage applied to the collectors of the transistors Q1 and Q2 is supplied through choke coils L1 and L2, and the connection point of the choke coils L1 and L2 undergoes decoupling by a choke coil L3 and a capacitor C2. The radiation of the output signal is maximum in a direction perpendicular to the printed circuit board 2. Further, transistors Q3 and Q4 are used for the purpose of buffering.

There is a technique as shown in FIG. 24, in which signals are transmitted and received in a non-contact state between a communication apparatus 301 having an antenna 303 and a communication apparatus 302 having an antenna 304 by utilizing the electromagnetic coupling generated between the antennas 303 and 304. When the antennas 303 and 304 of the communication apparatuses 301 and 302 consist of ordinary RCL circuits as shown in FIG. 25, the equivalent circuits of the antennas 303 and 304 are as shown in FIG. 26. The communication conducted between the antennas 303 and 304 is effected by the mutual inductance M.

Impedances Z1 through Z5 in FIG. 26 are as follows: Z1 corresponds to the impedance $1/j\omega C1$ of the capacitor C1 of the antenna 303; Z2 corresponds to the synthetic impedance $R1+j\omega(L1-M)$ consisting of the resistance R1 of the antenna 301 and the inductance L1−M obtained by subtracting the mutual inductance M from the inductance L1; Z3 corresponds to the impedance $j\omega M$ corresponding to the mutual inductance M; Z4 corresponds to the synthetic impedance $R2+j\omega(L2-M)$ consisting of the resistance of the antenna 2 and the inductance L2−M obtained by subtracting the mutual inductance M from the inductance L2; and Z5 corresponds to the impedance $1/j\omega C2$ of the capacitor C2 of the antenna 302.

In the circuit shown in FIG. 26, assuming that the current flowing through the impedance Z2 is i1 and that the current flowing through the impedance Z5 is i2, the currents i1 and i2 can be expressed by the following formulas 1 and 2.

$$i1 = -SEin \times Z1/\{Z1+Z2+Z3(Z4+Z5)/(Z3+Z4+Z5)\} \quad (1)$$

$$i2 = i1 \times Z3/(Z3+Z4+Z5) \quad (2)$$

Here, S indicates the mutual susceptance of the amplifier driving the antenna 301. Thus, −SEin indicates the total current of the circuit.

And, the voltage E2 applied to both ends of the antenna 302 is expressed by the following formula 3.

$$E2 = i2 \times Z5 = i1 \times Z3 \times Z5/(Z3+Z4+Z5) \quad (3)$$

From formulas 1 through 3, the reciprocal of amplification degree D, which is the inverse number of the amplification degree G, is obtained as shown by the following formula 4.

$$D=1/G=Ein/E2=\{-1/(S\times Z1\times Z3\times Z5)\}\times\{(Z1+Z2+Z3)(Z3+Z4+Z5)-Z3^2\} \quad (4)$$

Here, assuming that both the primary circuit and the secondary circuit are resonating, the resonance frequency $\omega 0$ is expressed by the following formula 5.

$$\omega_0 = 1/\sqrt{L_1 C_1} 1/\sqrt{L_2 C_2} \quad (5)$$

And, assuming that the coupling coefficient is k, k is expressed by the following formula 6 from the values of the mutual inductance M and the inductance L1 and the inductance L2 of the antenna 301 and the antenna 302.

$$k = M/\sqrt{L_1 L_2} \quad (6)$$

Further, assuming that the Q (quality factor) at the time of resonance is Q1 in the primary circuit and Q2 in the secondary circuit, Q1 and Q2 are expressed by the following formulas 7 and 8.

$$Q1 = \omega OL1/R1 \quad (7)$$

$$Q2 = \omega OL2/R2 \quad (8)$$

Thus, assuming that the loss factor d is d1 in the primary circuit and d2 in the secondary circuit, the loss factor d1 and the loss factor d2 are expressed by the following formulas 9 and 10.

$$d1 = 1/Q1 \quad (9)$$

$$d2 = 1/Q2 \quad (10)$$

Assuming that the detuning factor indicating the difference between the actual communication frequency (and the resonance frequency $\omega 0$ is x, the detuning factor x is expressed by the following formula 11.

$$x = (\omega - \omega 0)/\omega 0 \quad (11)$$

Here, it is the proximity to the resonance point that is in question, so that the following formula 12 holds true.

$$\omega \approx \omega_0 \quad (12)$$

Thus, by substituting formulas 5 through 12 into formula 4 and performing arrangement, formula 13 is obtained.

$$D = \frac{-j}{s\omega_0 \sqrt{L_1 L_2}} \times \frac{1}{k}\{(d_1 + 2jx)(d_2 + 2jx) + k^2\} \quad (13)$$

Here, regarding the frequency characteristics of the reciprocal of amplification gain, the absolute value of $1/k\{(d1+j2x)\{d2+j2x\}+k^2\}$, which is the variable portion of formula 12, is to be considered, so that the following formula 14 is used as the frequency characteristics of the reciprocal of amplification gain y.

$$y = \frac{1}{k}\sqrt{16x^2 - 4(2k^2 - d_1^2 - d_2^2)x^2 + (k^2 + d_1 d_2)^2} \quad (14)$$

The maximum point and the minimum point at the point of inflection of the frequency characteristics (communication efficiency) are points at which dy/dx=0 in formula 14, so that the maximum point is expressed by the following formulas 15 and 16, and the minimum point is expressed by the following formulas 17 and 18.

$$x0 = 0 \quad (15)$$

$$y0 = (k2 + d1d2)/k \quad (16)$$

$$x_b = \pm \frac{1}{2}\sqrt{\frac{2k^2 - (d_1^2 + d_2^2)}{2}} \left(1 \geq k \geq \sqrt{\frac{d_1^2 + d_2^2}{2}}\right) \quad (17)$$

$$y_b = \frac{d_1 + d_2}{2k}\sqrt{4k^2 - (d_1 - d_2)^2} \quad (18)$$

Further, the optimum coupling coefficient k0 providing the maximum gain (that is, at the time of critical coupling) is k, which provides the relationship dy0/dk=0 when formula 16 is differentiated with respect to k, so that the optimum coupling coefficient k0 is expressed by formula 19.

$$k_0 = \sqrt{d_1 d_2} 1/\sqrt{Q_1 Q_2} \quad (19)$$

The y0 at that time can be obtained by substituting formula 19 into formula 16. Formula 20 shows the value of y0 at the time of critical coupling.

$$y_0 = 2\sqrt{d_1 d_2} \quad (20)$$

Thus, the gain G0 is expressed by formula 21.

$$G_0 = \frac{s\omega_0 \sqrt{L_1 L_2 Q_1 Q_2}}{2} \quad (21)$$

Assuming that the antenna 303 and the antenna 304 are of the same performance, d1=d2=d=k0, y0=yb=2d. FIG. 27 shows the transfer frequency characteristic y when, in formula 11, the coupling coefficient k is k<k0, k=k0, and k>k0. It can be seen from FIG. 27 that when the coupling coefficient k satisfies the relationship k, y exhibits a single peak characteristic, and as k approaches k0, the value of y when x=0 decreases; when k>k0, the transfer frequency characteristic y from the antenna 303 to the antenna 304 changes from the single peak characteristic to a wavy (double peak) characteristic, and the maximum value of the communication efficiency (that is, the minimum value of the transfer frequency characteristic y) at the time of critical coupling (k=k0) is the same as that at the time of wavy characteristic (k>k0). Further, the voltage value E1 of the antenna 1 exhibits substantially the same characteristic. As can be seen from these facts, the critical coupling point k0 being the border, even when k decreases, the passing range center frequency level decreases, and the communication efficiency deteriorates. That is, it can be seen that communication is difficult to perform when the non-contact distance (inter-antenna distance) is too small or too large.

The inter-antenna coupling coefficient k is determined by the antenna configuration, the relative distance, etc., while, as shown in formula 19, the critical coupling condition k0 is determined by the Q1 and the Q2 of the antenna 303 and the antenna 304. Thus, by adjusting the Q of the antenna, it is possible to some degree to control the transfer frequency characteristic, for example, whether the transfer frequency at a certain coupling coefficient k exhibits a single peak characteristic or a wavy characteristic. That is, by effecting binary variation of the value of this Q in accordance with the information to be transmitted, it is possible to effect transmission and reception of information between the antennas by utilizing ASK (amplitude shift keying).

Generally speaking, as compared with the communication apparatus 301, the communication apparatus 2 is devoid of power source, and retains the spreading of the ASK band and rectifies a high-frequency signal to utilize it as the power source for itself, so that the degree of modulation is set to be low modulation. When information is transferred from the communication apparatus 2 to the communication apparatus 301, the Q2 of the antenna 304 is equivalently varied in accordance with the information to be transmitted, so that the resistance R2 of the antenna 304 is turned ON/OFF (FIG. 25). When information is transmitted from the communication apparatus 301 to the communication apparatus 2, the circuit current value of the antenna 303 is varied in accordance with the information to be transmitted. The mutual communication is performed on a time division basis (semi-double system); while the communication apparatus 301 is transmitting a signal, the Q2 of the communication apparatus 302 is fixed, and while the communication apparatus 302 is transmitting a signal, the circuit current value of the communication apparatus 301 is fixed.

FIG. 28 shows the transfer frequency characteristic (the output voltage with respect to the communication frequency) when the resistance R2 of FIG. 25 is turned OFF when the information signal bit is 0 and turned ON when the information signal bit is 1. When the carrier signal frequency is in the proximity to 13.56 MHz (point c), a signal exhibiting an amplitude variation corresponding to the turning ON/OFF of the resistance R2 is supplied to the antenna 303 of the communication apparatus 301. The difference in this transfer amplitude is the ASK signal obtained at the communication apparatus 301. While in this case a binary variation is achieved through a combination of the wavy characteristics, it is possible, in some cases, to achieve a binary variation through a combination of wavy characteristic and single-peak characteristic.

Incidentally, when a recording medium cassette is held by a cassette holding member, if there is a metal portion in the portion opposed to the cassette-side antenna, the radio wave is not propagated in a satisfactory manner even if the recording/playback-apparatus-side, i.e., the apparatus-side antenna, is opposed to the cassette-side antenna, so that the communication cannot be performed in a satisfactory manner.

Further, when the size of the recording/playback apparatus is to be reduced, the cassette holding member has to be formed of a metal from the viewpoint of strength.

SUMMARY OF THE INVENTION

In view of this, it is an object of the present invention to make it possible to reduce the size of a recording/playback apparatus which performs communication in a non-contact state to and from an in-cassette memory recording information regarding recording contents or the like.

To achieve the above object, there is provided, in accordance with the present invention, a recording/playback apparatus comprising a recording/playback mechanism portion performing recording and/or playback with respect to a recording medium cassette, a cassette holding member which holds the recording medium cassette, which moves between a recording/playback position near the recording/playback apparatus where recording and/or playback is conducted with respect to the recording medium cassette and a cassette passing position spaced apart from the recording/playback mechanism portion where the passing of the recording medium cassette is effected, and at least the portion of which opposed to the cassette-side antenna is formed of a metal, a cassette passing member which moves between a holding position where the recording medium cassette is held by the cassette holding member and an eject position where the recording medium cassette is inserted and detached in a direction crossing the movement path of the cassette holding member, and an apparatus side antenna for effecting communication through the in-cassette memory and the cassette-side antenna, wherein an electric wave transmission portion is formed in the portion of the cassette holding member opposed to the cassette-side antenna, and wherein the apparatus-side antenna is arranged in correspondence with the electric wave transmission portion.

Thus, in the recording/playback apparatus of the present invention, the communication between the cassette-side antenna and the apparatus-side antenna is conducted efficiently, and, further, the cassette holding member can be formed by using a metal, so that it is possible to reduce the size of the recording/playback apparatus.

As described above, when the coil formed by the development of the pattern on the printed circuit board is realized in a two-layer substrate, a coil having an intermediate tap and sacrificing inductance (a coil whose number of turns is small) is selected as in the case of the printed circuit board 201 described with reference to FIG. 14. However, when a large inductance is to be obtained, it is necessary to select a coil which is not provided with an intermediate tap as in the case of the printed circuit board 220 described with reference to FIG. 15. When a coil which is not provided with an intermediate tap is used, for example, in the antenna of a transmission circuit in radio communication, electromagnetic coupling communication or the like, it is necessary to provide external choke coils L1 and L2 for supplying power to the antenna as in the case of the circuit described with reference to FIG. 17, resulting in an increase in cost and expansion of circuit scale. Further, in the case in which a three-layer substrate is used to provide an intermediate tap while improving the inductance of the coil, as in the case of the printed circuit board described with reference to FIG. 16, the substrate cost increases due to the increase in the number of layers of the substrate. Further, due to the increase in the substrate thickness, it is difficult to realize a thin antenna such as a card type one.

The present invention has been made in view of the above problem. It is an object of the present invention to improve the reactance, for example, in a printed circuit board in which the number of two-layer substrates is small, and further make it possible to provide an intermediate tap.

The printed circuit board as disclosed in claim 1 is characterized in that, on one and the other side of the printed circuit board, a plurality of patterns forming the coil are developed concentrically.

In the printed circuit board disclosed in claim 1, the plurality of patterns forming a coil on one and the other side of the printed circuit board are developed concentrically.

However, as shown in FIG. 28, as the carrier signal frequency approaches 13.097 MHz (point a), the difference in amplitude with respect to the ON/OFF of the resistance R2 decreases, and the degree of modulation of ASK decreases. And, when the carrier signal frequency reaches 13.097 MHz (point a), the difference in amplitude disappears, and it is impossible to transmit a signal from the communication apparatus 302 to the communication apparatus 301. This point will be referred to as "modulation null point". Further, at 14.262 MHz (point b) also, a trouble similar to that at 13.097 MHz (point a) is generated. When this modulation null point is passed, it is possible to obtain a modulation signal again. Although the 0/1 polarity at the time of modulation is inverted, it is all bits that are inverted, so that this can be easily coped with on the reception side, making it possible to correctly decode the data.

While in the case described with reference to FIG. 28 the communication frequency is changed, a similar is trouble is also generated in the case in which the communication frequency is fixed and there is a variation in the resonance frequencies of the antennas. FIG. 29(A) shows the examination result of the practical communication distance when the antenna resonance frequency of the antenna 303 of the communication apparatus 301 is tuned to the communication frequency 13.56 MHz, and a variation is caused to occur in the antenna resonance frequency of the antenna 304 of the communication apparatus 302, and FIG. 29(B) shows the examination result of the practical communication distance when the antenna resonance frequency of the antenna 303 of the communication apparatus 301 is tuned to the communication frequency 14.1 MHz, and a variation is caused to occur in the antenna resonance frequency of the antenna 304 of the communication apparatus 302.

As described above, when the distance between the communication apparatus 301 and the communication apparatus 302 is too deviated from the critical coupling point (for example, when the inter-antenna distance is over 4 mm) and when it is too close to the critical coupling point (for example, when the inter-antenna distance is shorter than 1.4 mm), whatever value the resonance frequency of the antenna 302 may take, a communication trouble is generated. However, communication trouble generated in other cases is a communication trouble due to the modulation null point. That is, communication trouble in the portion where the resonance frequency of the antenna 304 of the communication apparatus 302 is 12.63 MHz at the resonance frequency 13.56 MHz of the antenna 303 of the communication apparatus 301 and where the communication distance is near 2.3 mm (the portion indicated by a in FIG. 29(A)), and communication trouble in the portion where the resonance frequency of the antenna 304 of the communication apparatus 302 is 13.84 MHz at the resonance frequency 14.1 MHz of the antenna 303 of the communication apparatus 301 and where the communication distance is near 2 mm to 2.6 mm and 3 mm to 3.6 mm (the portion indicated by b and c in FIG. 29(B)), are generated due to the modulation null point.

In this way, when there is a variation in the antenna resonance frequency of the communication apparatus 301 and the communication apparatus 302, communication is possible or impossible depending upon the communication distance.

Further, when the value of the Q of the antenna to increase the communication distance, the modulation null point is more easily generated in the proximity to the target communication frequency. Further, assuming that the permissible value of the variation in the general-purpose parts constituting the antenna is, for example, ±5%, the possibility of these troubles being generated is very high, so that it is difficult to realize a con-contact communication which is highly reliable with no adjustment.

The present invention has been made in view of the above problem. It is an object of the present invention to realize a con-contact communication which is highly reliable with no adjustment by checking the transmission/reception condition, selecting an appropriate resonance frequency from a plurality of resonance frequencies depending on the checking result, and effecting switching automatically.

BRIEF DESCRIPTION OF THE DRAWINGS

FIG. 10 is a block diagram showing a communication circuit;

FIG. 14 is a diagram showing a relevant example of a coil formed through pattern development on a printed circuit board;

FIG. 19 is a diagram illustrating the position of a coil and an intermediate tap formed on the printed circuit board of FIG. 18;

DESCRIPTION OF THE PREFERRED EMBODIMENTS

Figure 1:
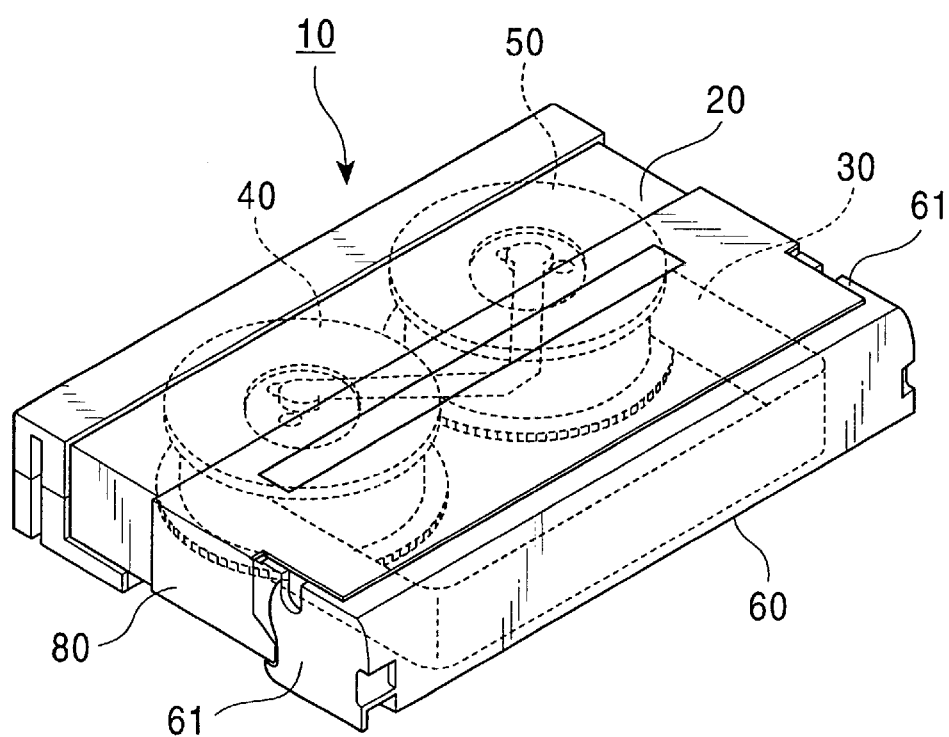
FIG. 1 is a perspective view which shows, together with FIGS. 2 through 4, an example of a tape cassette used in the recording/playback apparatus of the present invention in a state in which the lid is at the closed position.
Figure 2:
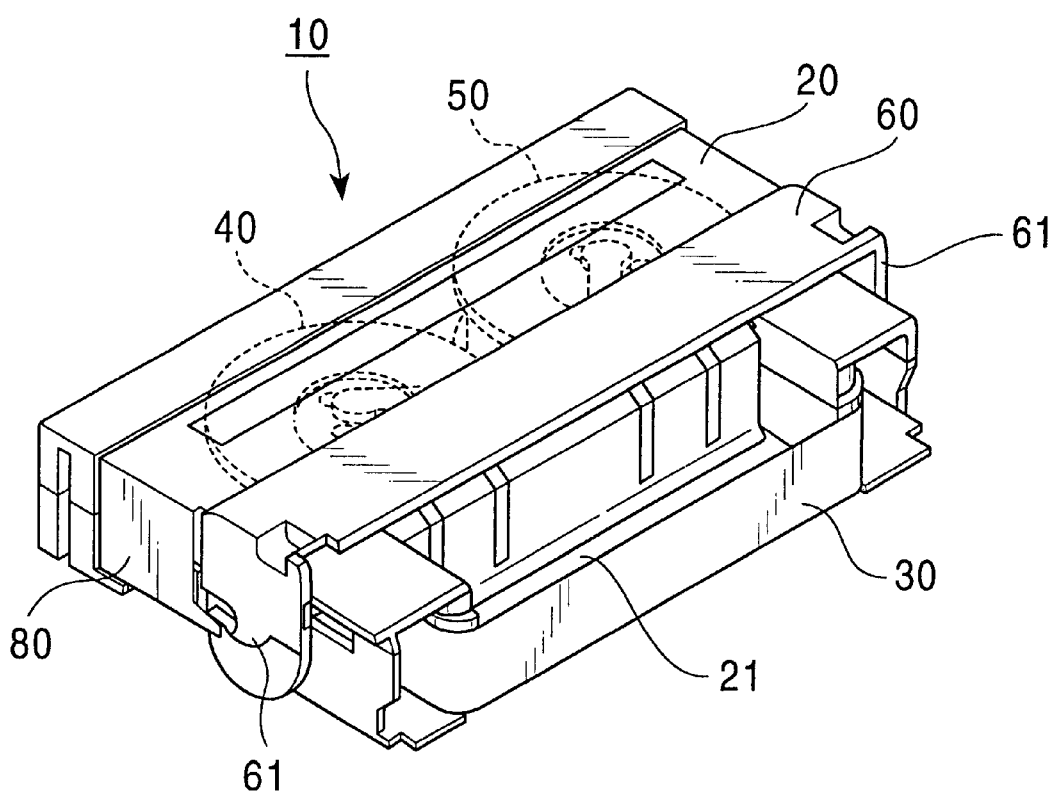
FIG. 2 is a perspective view showing the lid in an open state.
Figure 3:
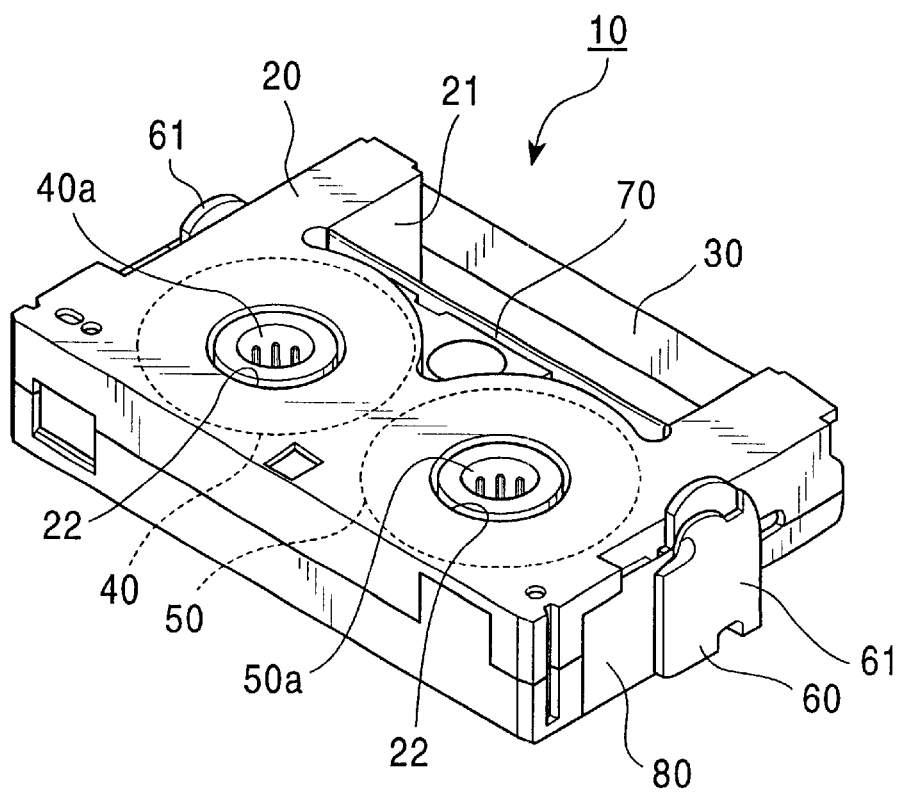
FIG. 3 is a perspective view showing the lid in the open state from below.
Figure 4A:
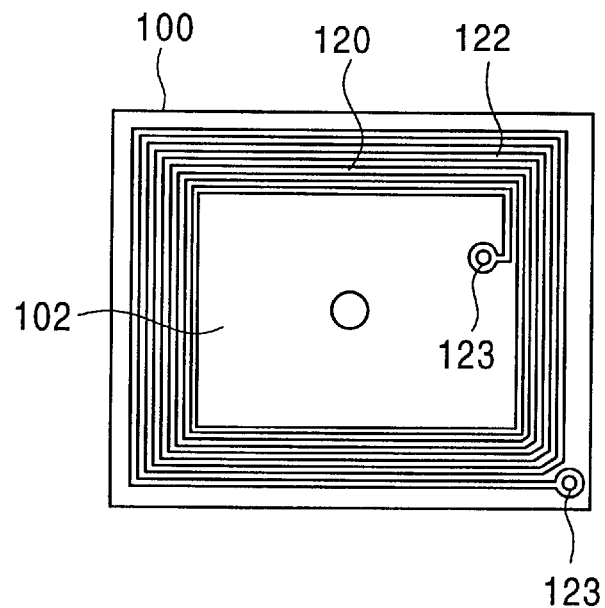
FIG. 4 is an enlarged view showing a memory substrate, of which portion (a) is an external view and portion (b) is an internal view.
Figure 4B:
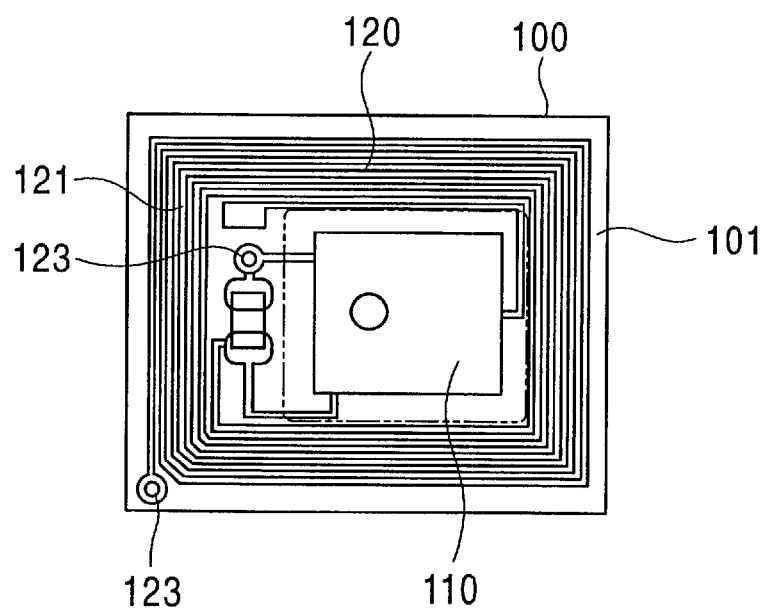

Embodiments of the recording/playback apparatus of the present invention will now be described with reference to the accompanying drawings. The embodiments shown perform recording and/or playback with respect to a tape cassette consisting of a cassette shell accommodating a magnetic tape as the recording medium.

First, the tape cassette used in the recording/playback apparatus of the present invention will be described.

A tape cassette 10 includes a thin box-like cassette shell 20 rotatably accommodating tape reels 40 and 50 around which a magnetic tape 30 is wound, and is provided with a front lid covering the front side of a portion of the magnetic tape 30 positioned along the front side of the cassette shell 20 and a back lid 70 covering the rear side of the magnetic tape 30, and the back lid 70 is formed integrally with the forward end of a slider 80 supported by the cassette shell 20 so as to be movable in the longitudinal direction, and, further, the front lid 60 is rotatably supported by the slider 80.

The cassette shell 20 is formed as a thin box and formed of plastic, and a large recess 21 called a mouth portion is formed in the front portion of the cassette shell 20. The mouth portion 21 is open in the front side and the upper and lower sides. And, a portion of the magnetic tape 30 is positioned along the front side of the mouth portion 21.

In the bottom plate of the cassette shell 20, there are formed reel base insertion holes 22, and when the tape cassette 10 is attached to the recording/playback apparatus, a reel base provided in the recording/playback apparatus is inserted into the cassette shell 20 through the reel base insertion holes 22, and engagement shafts provided on the reel base are engaged with reel base engagement holes 40a and 50a formed in the tape reels 40 and 50 so as to be open on the lower side.

On the inner side of a left-hand side surface portion 61 of the front lid 60, there is arranged a lid lock member 90, and when it is not used, the lid lock member 90 locks the front lid 60 in a closing position covering the front side of the magnetic tape 30.

In the cassette shell, there is arranged a memory substrate. In substantially the central portion of an inner side surface 101 of the memory substrate 100, there is mounted a memory chip 110, and an in-cassette memory is formed by the memory chip 110. And, a cassette-side antenna 120 is integrally formed on the memory substrate 100. That is, on the inner side surface 101 and the outer side surface 102 of the memory substrate 100, there are formed spiral antenna patterns 121 and 122, and these antenna patterns 121 and 122 are connected through a through-hole 123 to form the cassette-side antenna 120, the cassette-side antenna 120 being connected to the in-cassette memory 110. And, the outer side surface 102 of the memory substrate 100 faces the exterior through a facing hole 23 formed in the back surface of the cassette shell 20.

A recording/playback apparatus 130 is provided with a main chassis 140, a slide chassis 150, a movable frame 160 and a cassette holder 170. And, these components are accommodated in an outer casing (not shown).

The main chassis 140 is provided with main mechanisms for drawing the magnetic tape 30 out of the cassette shell 20, forming a predetermined tape path and causing the tape to run, etc., such as a rotary head drum 141 and tape draw-out guides 142, constituting a recording/playback mechanism portion for performing recording and playback with respect to the tape cassette 10.

The slide chassis 150 is positioned on the front side of the main chassis 140 and supported so as to be movable in the longitudinal direction with respect to the main chassis 140. The slide chassis 150 is formed such that side plates 152 are raised from the right and left side edges of a bottom plate 151 consisting of a metal plate and that a front plate 153 is raised from the front edge of the bottom plate 151. And, a substantially rectangular opening 153a is formed at a position nearer to one side portion of the front plate 153.

A cosmetic panel 154 is formed of a material such as plastic, which is non-magnetic and non-conductive but which transmits electric wave, and is mounted so as to cover the front side of the front plate 153.

The above-described tape cassette 10 is attached to this slide chassis 150, forming a cassette holding member which is moved between a recording/playback position where it is drawn into the main chassis 140 to perform recording and playback with respect to the tape cassette 10 and a passing position where it is drawn out of the main chassis 140 to perform the passing of the tape cassette between it and the cassette holder 170, reel bases 155, etc. to be engaged with the tape reels 40 and 50 to rotate them being provided. And, the reel bases 155 have upwardly protruding reel engagement shafts 155a.

The movable frame 160 includes a substantially rectangular, frame-like top surface portion 161, from the right and left side edges of which side plates 162 downwardly protrude, the rear end portions of the side plates 162 being rotatably supported by the rear end portion of the main chassis 140 and upwardly biased by a torsion coil spring 163. Guide slits 162a extending in the longitudinal direction are formed in the side plates 162.

Substantially the front half portions at the upper ends of the side plates 171 of the cassette holder 170 are connected by a front top plate 172, and the rear end portions of the side plates 171 are connected by a rear end top plate 173. Receiving plates 174 protrude from the lower edges of the side plates 151 so as to approach each other.

And, the cassette holder 170 supported by the movable frame 160 so as to be movable in the longitudinal direction. Further, slide pins 175 protruding from the side plates 171, which are members supporting the cassette holder 170 on the movable frame 160, are slidably engaged with guide slits 162a of the movable frame 160.

One end portions of rotary links 180 are rotatably connected to the portions of the side plates 171 of the cassette holder 170 protruding from the lower edges of the side plates 162 of the movable frame 160, and the other end portions of the rotary links 180 are rotatably supported by the front plate 153 of the slide chassis 150.

This slide holder 170 constitutes a cassette passing member moving between a holding position where the tape cassette is held by the slide chassis 150 and an eject position where the tape cassette 10 is inserted and detached.

The memory chip (in-cassette memory) 110 is a passive device which performs control processing after receiving an electric wave, and is formed as a so-called battery-less component having no power source. Thus, it is provided with a power source circuit, a control circuit, a memory, etc. obtaining power by electromagnetic induction.

In correspondence to this, the recording/playback apparatus 130 is provided with an apparatus-side antenna 190 for performing communication with the in-cassette memory 110 through the cassette-side antenna 120. In the apparatus-side antenna 190, spiral antenna patterns 192 are formed on both sides of the antenna substrate 191, and these antenna patterns 192 are connected by a through-hole 193, and one antenna pattern 192 is connected directly, and the other antenna pattern 192 is connected through the through-hole 193, to the terminals 194. And, the apparatus-side antenna 190 is attached to the front plate 153 such that the antenna patterns 192 are positioned in correspondence with the opening 153a of the front plate 153 of the slide chassis 150.

And, the recording/playback apparatus 130 has a communication circuit 200 for performing recording and reading of information with respect to the in-cassette memory 110 through the apparatus-side antenna 190 and the cassette-side antenna 120, and the communication circuit 200 is provided with an R/W portion 201, a data processing portion 202 and a control portion 203. That is, the R/W portion 201 performs modulation and amplification of the signal supplied to the apparatus-side antenna 190, demodulation of the signal obtained from the apparatus-side antenna 190, etc., the data processing portion 202 performs data processing such as coding of the signal transmitted to the R/W portion 201, decoding of the signal received from the R/W portion 201 or CRC, and the control portion 203 is formed, for example, by a microcomputer, and performs general control such as the controlling of the above communication, the operation of the recording/playback apparatus 130 and display. By this communication circuit 200, information recording with respect to the in-cassette memory 110 and the reading of the information recorded in the in-cassette memory 110. And, the apparatus-side antenna 190 is connected to the R/W portion 201 of the communication circuit 200 through the terminals 194.

As described above, the in-cassette memory 110 is formed as a battery-less component, so that it is necessary to provide between the cassette-side antenna 120 and the apparatus-side antenna 190 electromagnetic coupling which is sufficient for effecting data transfer and power transfer. Thus, to secure the communication distance, a construction which cuts off or restricts the magnetic path by metal is not desirable. In the above recording/playback apparatus 130, the apparatus-side antenna 190 is arranged in correspondence with the opening 153a of the front plate 153 of the slide chassis 150, so that there is nothing to cut off the magnetic path, making it possible to secure a sufficient electromagnetic coupling between the apparatus-side antenna 190 and the cassette-side antenna 120.

The opening 153a of the front plate 153 of the slide chassis 150 is provided so as not to cut off the magnetic path, so that, if there is a problem such as a deterioration in strength due to the formation of the opening, it is possible to cover the opening 153a with a material which is non-magnetic and non-conductive and which transmits an electric wave, for example, a plastic plate.

Further, when the cosmetic plate 154 is formed of a material which is magnetic and conductive and which does not easily transmit an electric wave, such as a metal plate, an opening is provided at a position in correspondence with the apparatus-side antenna 190, thereby making it possible not to cut off the magnetic path.

Next, the recording/playback operation using the tape cassette 10 will be described.

Figure 5:
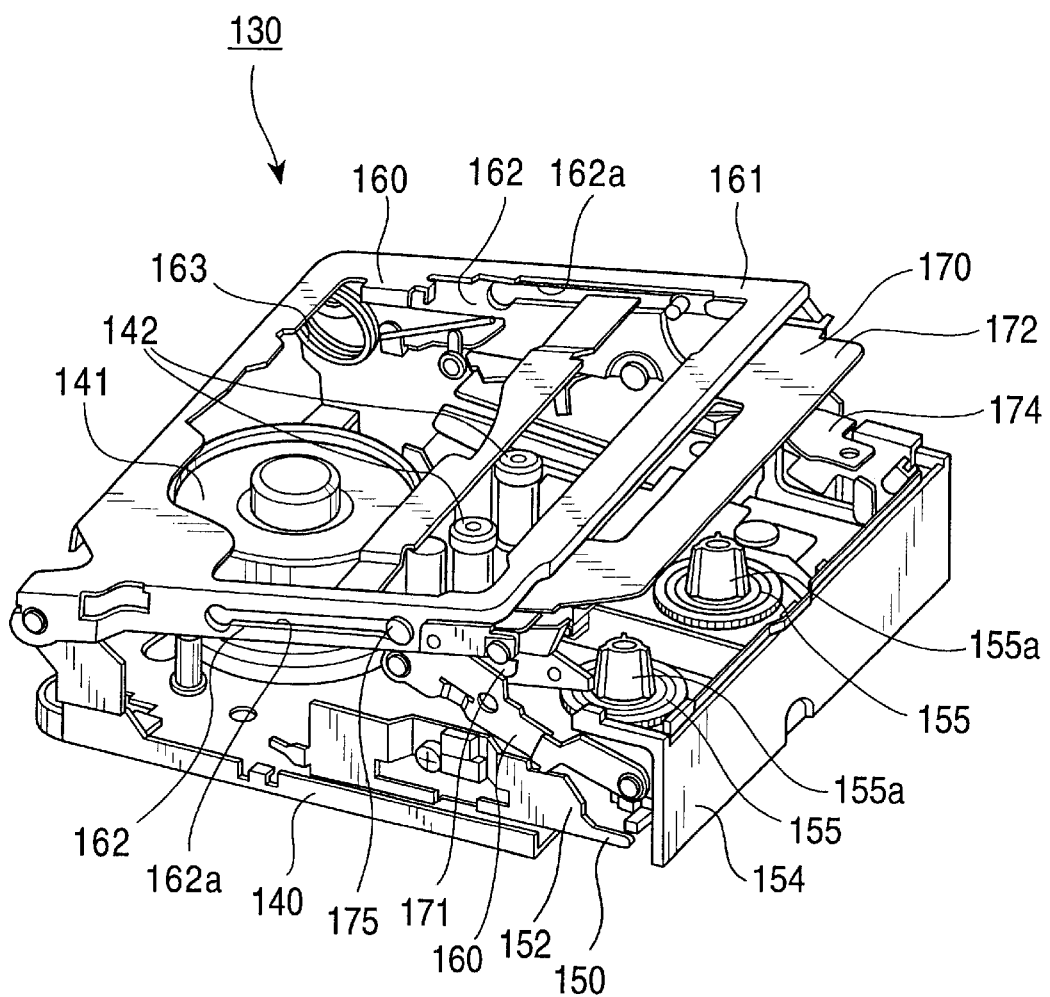
FIG. 5 is a schematic perspective view which shows, together with FIGS. 6 through 13, an embodiment of the recording/playback apparatus of the present invention in a state in which the cassette holder is at an eject position.
Figure 6:
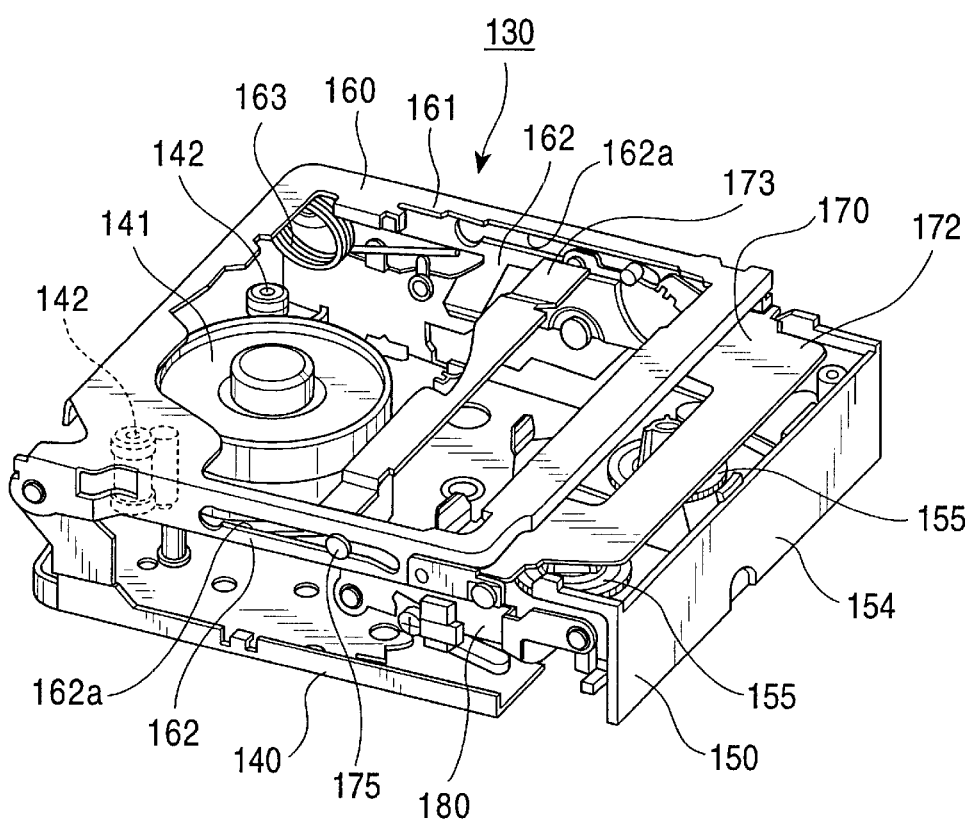
FIG. 6 is a schematic perspective view showing a state in which the cassette holder is lowered to a holding position which is on a slide chassis at a cassette passing position.
Figure 11:
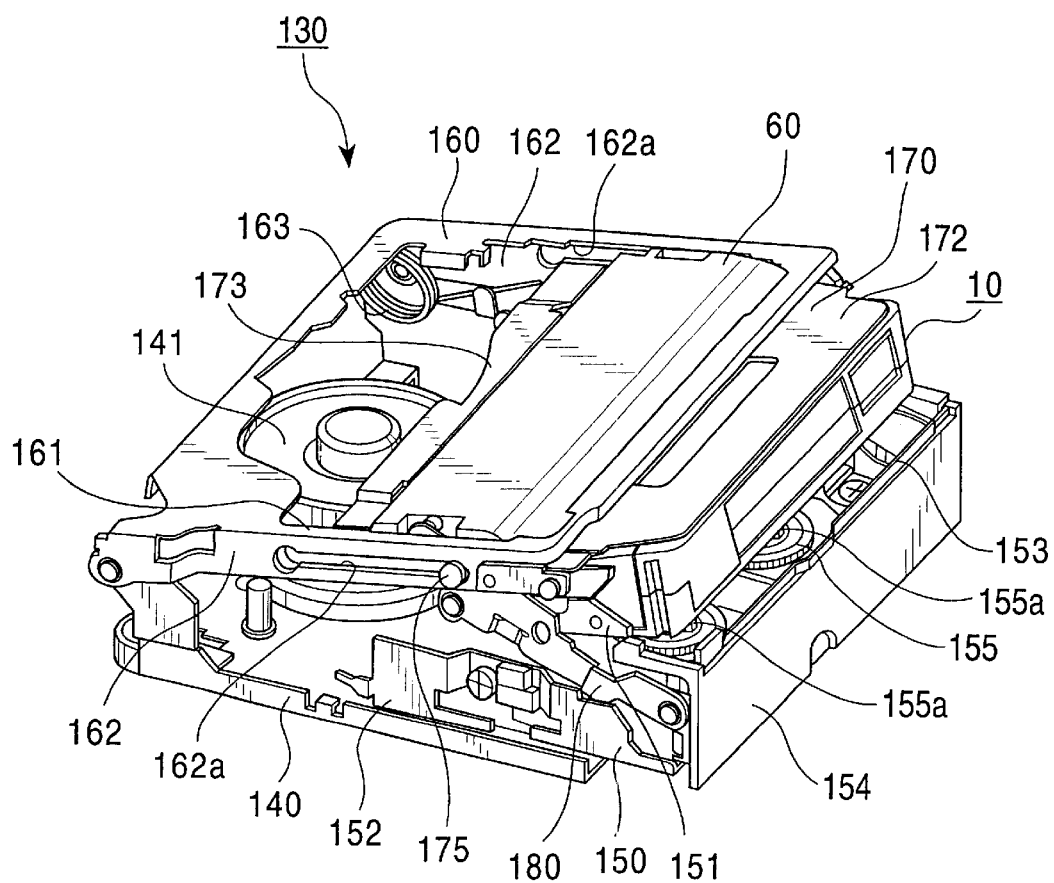
FIG. 11 is a schematic perspective view showing a state in which a tape cassette is inserted into the cassette holder at the eject position.
Figure 12:
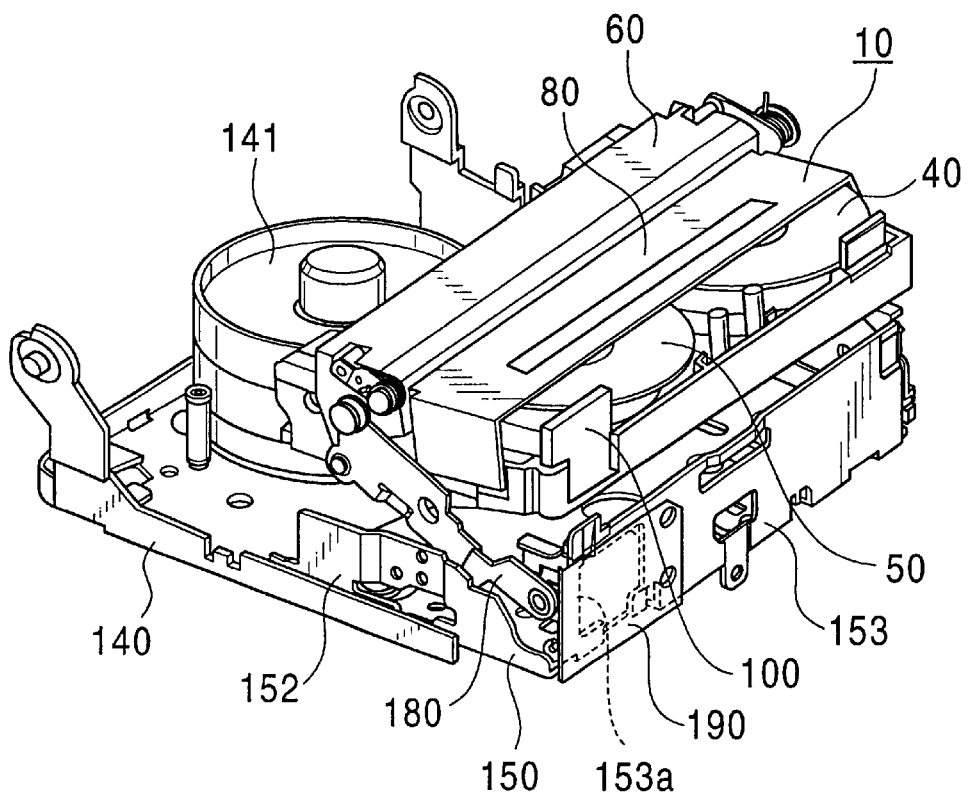
FIG. 12 is a schematic perspective view, partially cutaway, which shows the state shown in FIG. 11 from a different angle.

The movable frame 160 rotates upwardly and, in a condition in which the cassette holder 170 is at the eject position shown in FIG. 5, the tape cassette 10 is inserted into the cassette holder 170 (See FIGS. 11 and 12). By inserting the tape cassette 10 into the cassette holder 170, the tape cassette 10 is held in the space formed by the side plates 171, the top plates 172 and 173 and the receiving plates 174, and the lock of the front lid 60 by the lid lock member 90 is cancelled; the front lid 60 rotates upwardly and the front lid 60 and the slider 80 (together with the back lid 70) are moved rearwardly, and the portion of the magnetic tape 30 positioned in front of the mouth portion 21 is opened and the upper portion of the mouth portion 21 is opened.

Next, when the movable frame 160 is downwardly rotated, the cassette holder 170 also descends; when the cassette holder 170 descends to the holding position at the lowermost end of the descent range (See FIG. 13), the reel bases 155 provided in the slide chassis 150 are inserted into the cassette shell 20 through the reel base insertion holes 22, and the reel engagement shafts 155a of the reel bases 155 are engaged with the reel engagement holes 40a and 50a of the tape reels 40 and 50. Further, the tape draw-out guides 142, the pinch roller (not shown), etc. are positioned inside the mouth 21.

Figure 7:
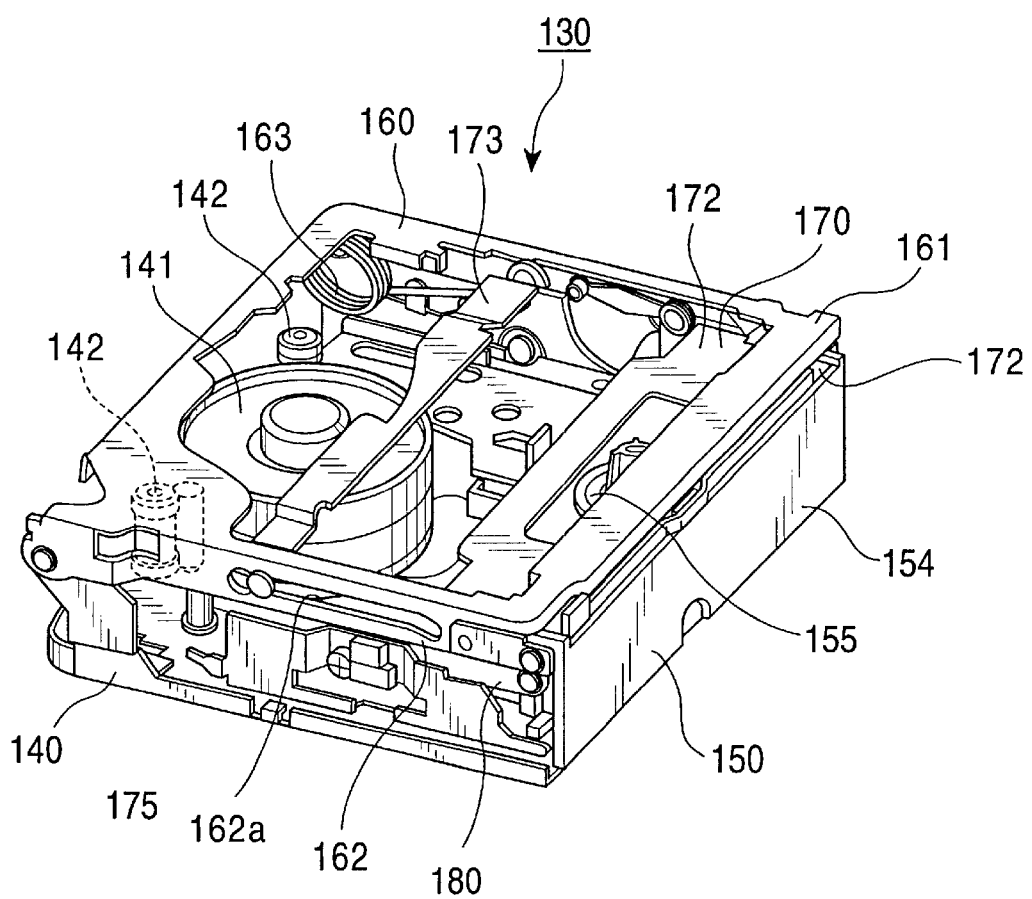
FIG. 7 is a schematic perspective view showing a state in which the slide chassis is drawn into the recording/playback apparatus together with the cassette holder.
Figure 8:
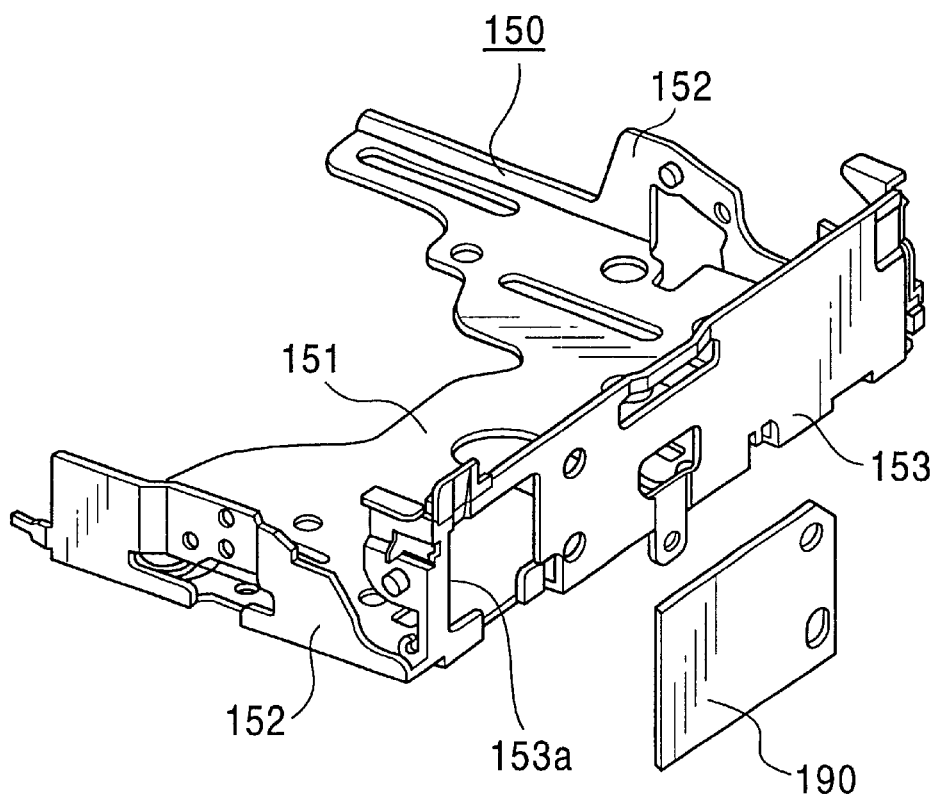
FIG. 8 is a schematic perspective view showing the outer contour of the slide chassis.
Figure 9A:
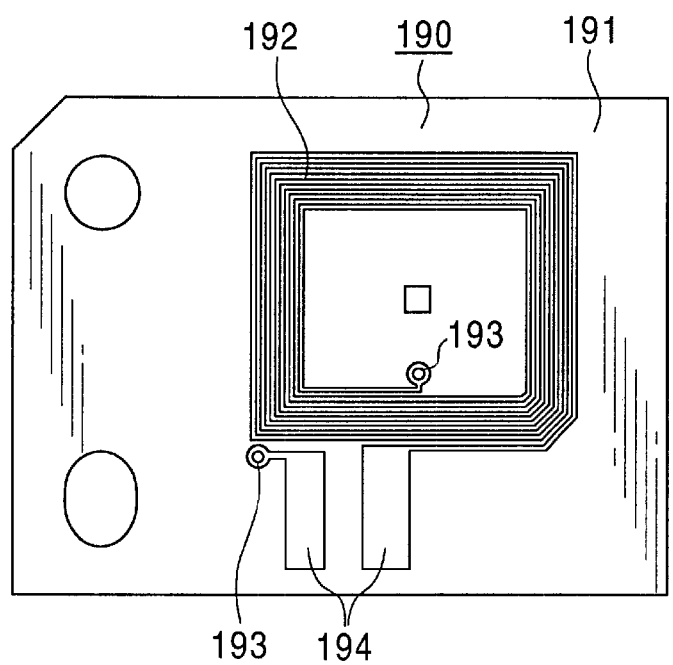
FIG. 9 shows an apparatus-side antenna, of which portion (a) is an internal view and portion (b) is an external view.
Figure 9B:
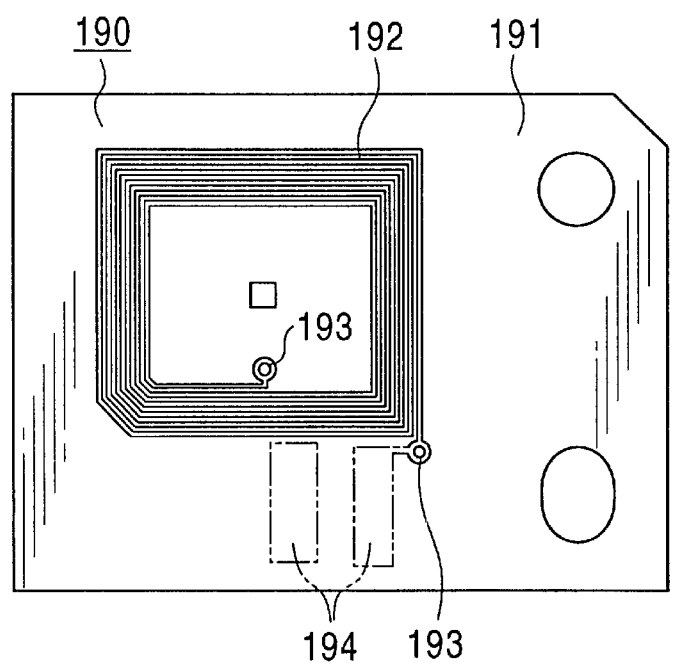
Figure 13:
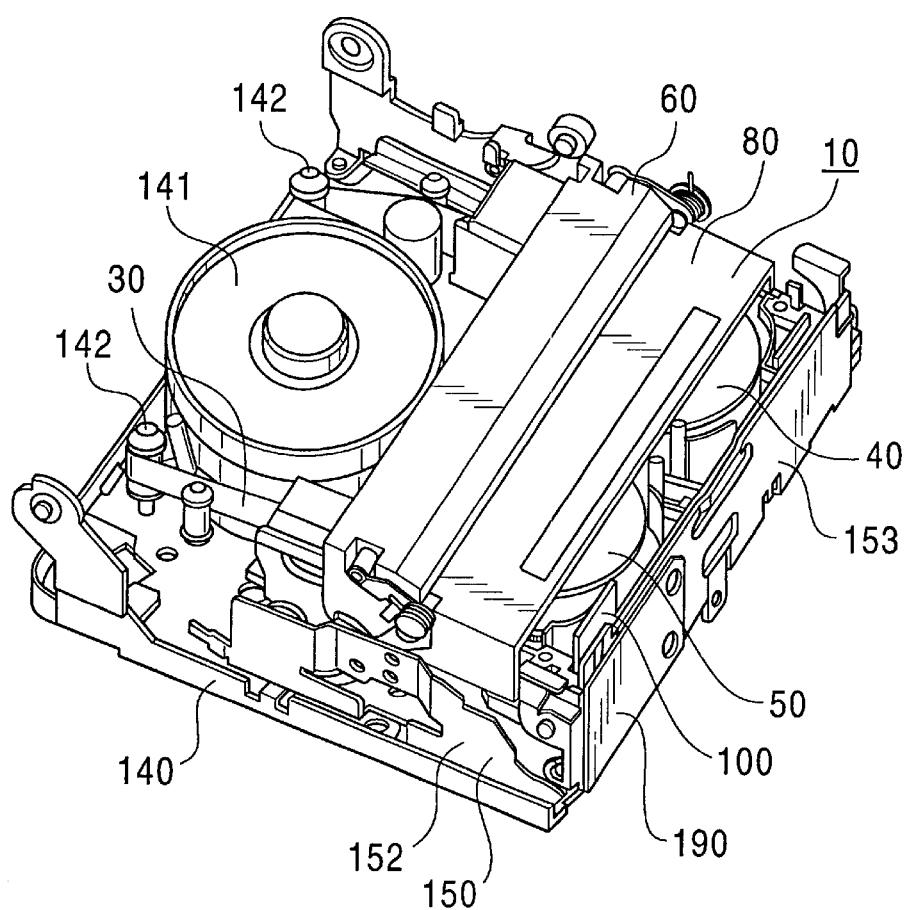
FIG. 13 is a schematic perspective view, partially cutaway, which shows the state in which the cassette holder holding the tape cassette is lowered and positioned at the holding position.
Figure 15A:
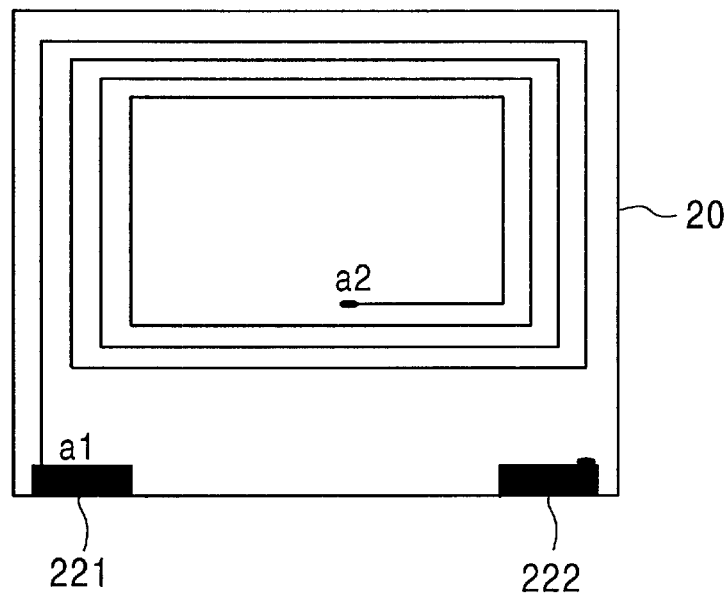
FIG. 15, consisting of FIGS. 15A and 15B, is a diagram showing a relevant example of a coil formed through pattern development on a printed circuit board.
Figure 15B:
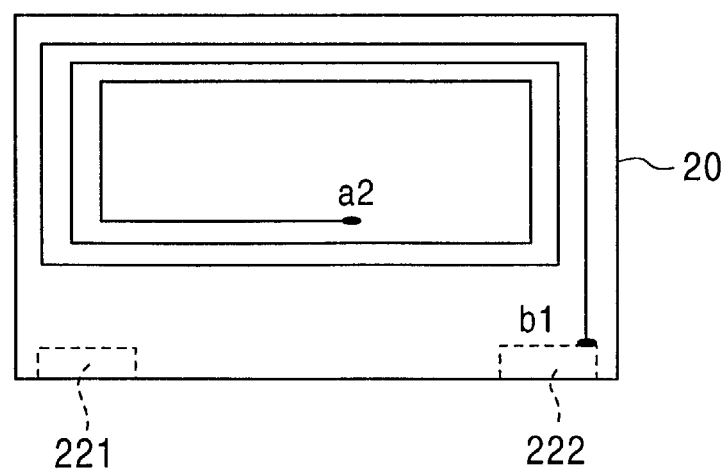
Figure 16A:
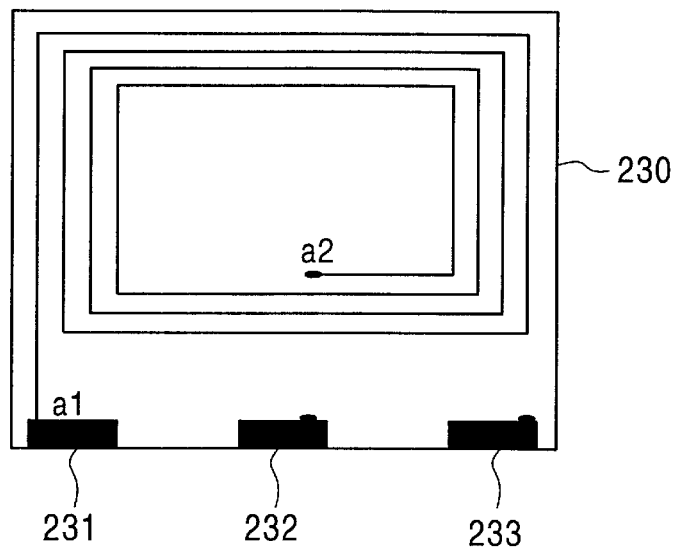
FIG. 16, consisting of FIGS. 16A, 16B and 16C, is a diagram showing a relevant example of a coil formed through pattern development on a printed circuit board.
Figure 16B:
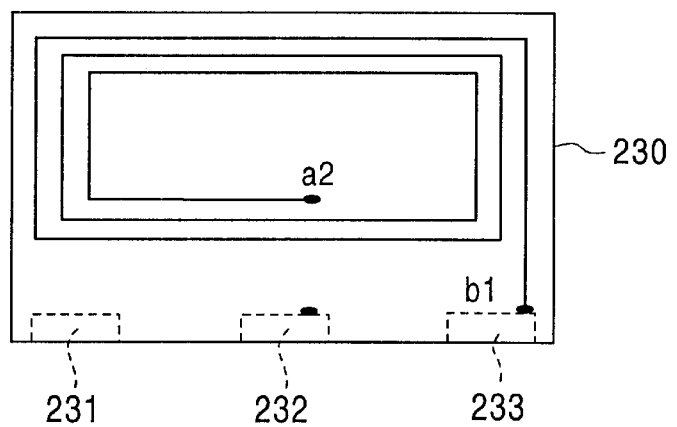
Figure 16C:
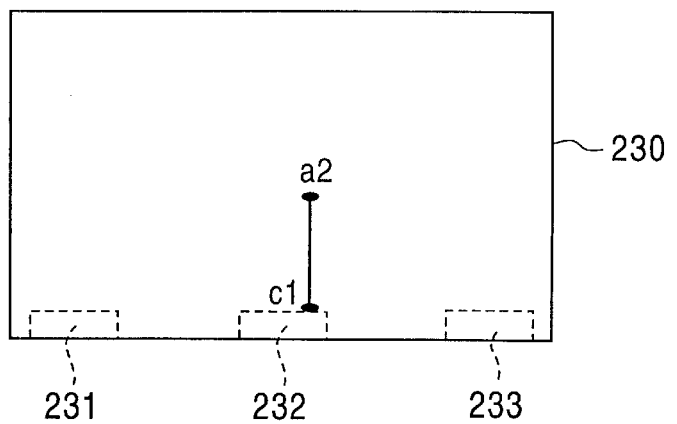

Further, in the condition shown in FIG. 13, the outer side surface of the cassette-side antenna 120 of the tape cassette 10 is opposed to the inner side surface of the apparatus-side antenna 190 provided on the front plate 153 of the slide chassis 150, and communication is possible between the recording/playback apparatus 130 and the in-cassette memory 110 of the tape cassette 10. Thus, in this recording/playback apparatus 130, the slide chassis 150 is drawn into the main chassis 140 (See FIG. 7), and it is possible to read the contents of the in-cassette memory 110 or to write information to the in-cassette memory 110 before the recording and playback with respect to the tape cassette 10 is possible. In the condition in which the slide chassis 150 is at the cassette passing position in which it is drawn out of the main chassis 140, it is possible to hold the front plate 153 close to the front side of the outer casing, that is, to hold the apparatus-side antenna 190 close to the front side of the outer casing, so that when the front side of the outer casing is non-magnetic and non-conductive or even when it is not so, the portion opposed to the apparatus-side antenna 190 is kept as an electric wave transmitting portion, whereby, even if the tape cassette 10 is not attached to the recording/playback apparatus, by opposing the cassette-side antenna 120 to the apparatus-side antenna 190 through the front side of the outer casing, it is possible to perform communication with the in-cassette memory 110 of the tape cassette 10 by driving the communication circuit 200. Thus, it is possible to know the recording contents of the tape cassette 10, etc. before the tape cassette 10 is attached to the recording/playback apparatus 130.

Next, the slide chassis 150 moves inwardly with respect to the main chassis 140, and reaches a predetermined draw-in position, that is, the recording/playback position.

And, when the slide chassis 150 reaches the recording/playback position, the tape draw-out guides 142, the pinch roller, etc. move to predetermined positions to draw the magnetic tape 30 out of the cassette shell 20, winding the magnetic tape 30 around the rotary head drum 141 at a predetermined winding angle and forming a predetermined tape path.

When recording or playback with respect to the magnetic tape 30 is completed, the components such as the tape draw-out guides 142 and the pinch roller move into the mouth portion 21, and the excess magnetic tape 30 is taken up on one tape reel 40.

Then, the slide chassis 150 is returned to the cassette passing position, and then the movable frame 160 rotates upwardly and the cassette holder 170 is positioned at the eject position. Then, the tape cassette 10 is drawn out of the cassette holder 170.

In the above recording/playback apparatus 130, the opening 153*a* is formed in the metal portion corresponding to the portion where the apparatus-side antenna 190 is positioned, so that a sufficient electromagnetic coupling is obtained between the apparatus-side antenna 190 and the cassette-side antenna 120, and the communication between the cassette-side antenna 120 and the apparatus-side antenna 190 is conducted efficiently, whereby it is possible to form the slide chassis 150, which is the cassette holding member, of a metal, so that it is possible to reduce the size of the recording/playback apparatus 130.

The configurations and structures of the portions of the above-described embodiment are only given by way of example, and they should not be construed as restricting the technical scope of the present invention.

Figure 18A:
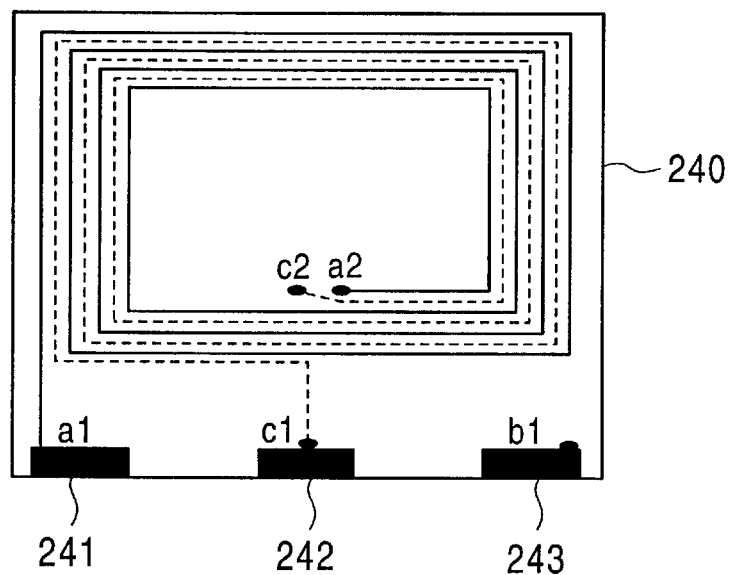
FIG. 18, consisting of FIGS. 18A and 18B, is a diagram showing a first embodiment of a printed circuit board to which the present invention is applied.
Figure 18B:
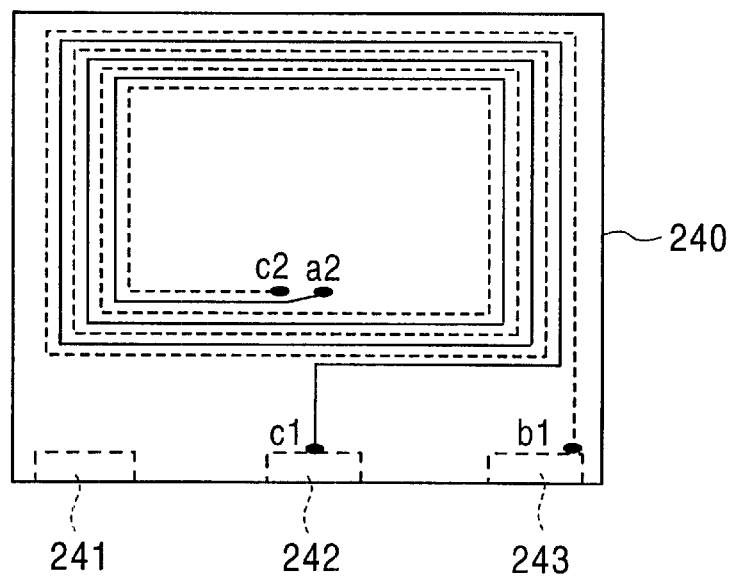

FIG. 18 shows the first embodiment of the printed circuit board to which present invention is applied. A printed circuit board 240 is a double-layer substrate; FIG. 18(A) is a pattern diagram of side A of the printed circuit board 240, and FIG. 18(B) is a perspective view of the pattern of side B of the printed circuit board 240 as seen from side A.

In the printed circuit board 240, two sets of spiral patterns, two on side A and two on side B, are developed concentrically. The spiral pattern (the solid line pattern of FIG. 18(A)) extending from a terminal (input terminal or output terminal) a1 connected to a tap 241 toward the center (inner periphery) is connected to side B through a through-hole a2, and, from the through-hole a2, a spiral pattern extending toward the outer periphery (the solid line pattern of FIG. 18(B)) is developed toward a through-hole c1 connected to a tap 242. This pattern is connected to side A again through the through-hole c1, and the spiral pattern (the dotted line pattern of FIG. 18(A)) extending from the through-hole c1 toward the center is connected to side B through a through-hole c2, and, from the through-hole c2, a spiral pattern (the dotted line pattern of FIG. 18(B)) extending toward the outer periphery is developed toward a through-hole (output terminal or input terminal) b1 connected to a tap 243.

The patterns of sides A and B of the printed circuit board 240, in plane form, are as shown in FIG. 19. That is, in FIG. 18(A), the pattern indicated by the solid line corresponds to the coil La1-a2 of FIG. 19; in FIG. 18(A), the pattern indicated by the dotted line corresponds to the coil Lc1-c2 of FIG. 19; in FIG. 18(B), the pattern indicated by the solid line corresponds to the coil La2-c1 of FIG. 19; and, in FIG. 18(B), the pattern indicated by the dotted line corresponds to the coil Lc2-b1 of FIG. 19.

Here, when the printed circuit board 240 is used as the coil of an antenna using a push-pull circuit, the tap 242, which is an intermediate tap, must exactly be a point electrically serving as the middle point. However, the inductance of the coil generated by each of the patterns of side A and side B of the printed circuit board exhibits a larger value on the outer periphery side than on the inner periphery side (the coil on the outer periphery side is longer than that on the inner periphery side). Thus, when the pattern of printed circuit board 240 moves from side A to side B, the connection is effected such that interchange occurs between the inner periphery and the outer periphery.

That is, the A-side pattern from the terminal a1 to the through-hole a2 is formed in the outer periphery; the B-side pattern from the through-hole a2 to the through-hole c1 is formed in the inner periphery; the A-side pattern from the through-hole c1 to the through-hole c21 is formed in the inner periphery; and the B-side pattern from the through-hole c2 to the through-hole b1 is formed in the outer periphery.

And, the inter-tap coils are formed by the A-side coil and the B-side coil, and combined such that the entire lengths of the inter-tap coils are substantially the same. Thus, as shown in FIG. 19, the portion form the tap 241 to the tap 242 and the portion from the tap 242 to the tap 243 are respectively formed by the A-side and B-side coils, and the inner periphery and outer periphery patterns are combined. As a result, the tap 242 can serve as the electrical middle point between the tap 241 and the tap 243.

Figure 20:
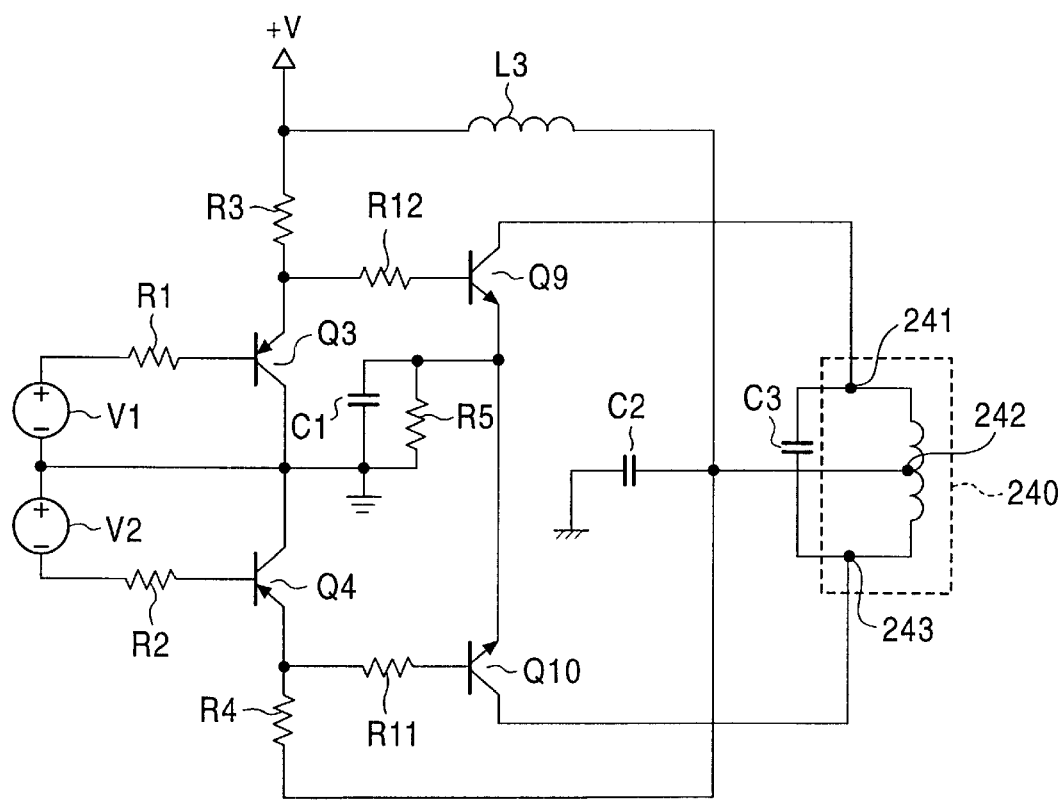
FIG. 20 is a circuit diagram of a communication apparatus in electromagnetic coupling non-contact communication using the printed circuit board of FIG. 18.

FIG. 20 shows a circuit diagram of a transmission apparatus in electromagnetic coupling non-contact communication using the printed circuit board 240.

Figure 17:
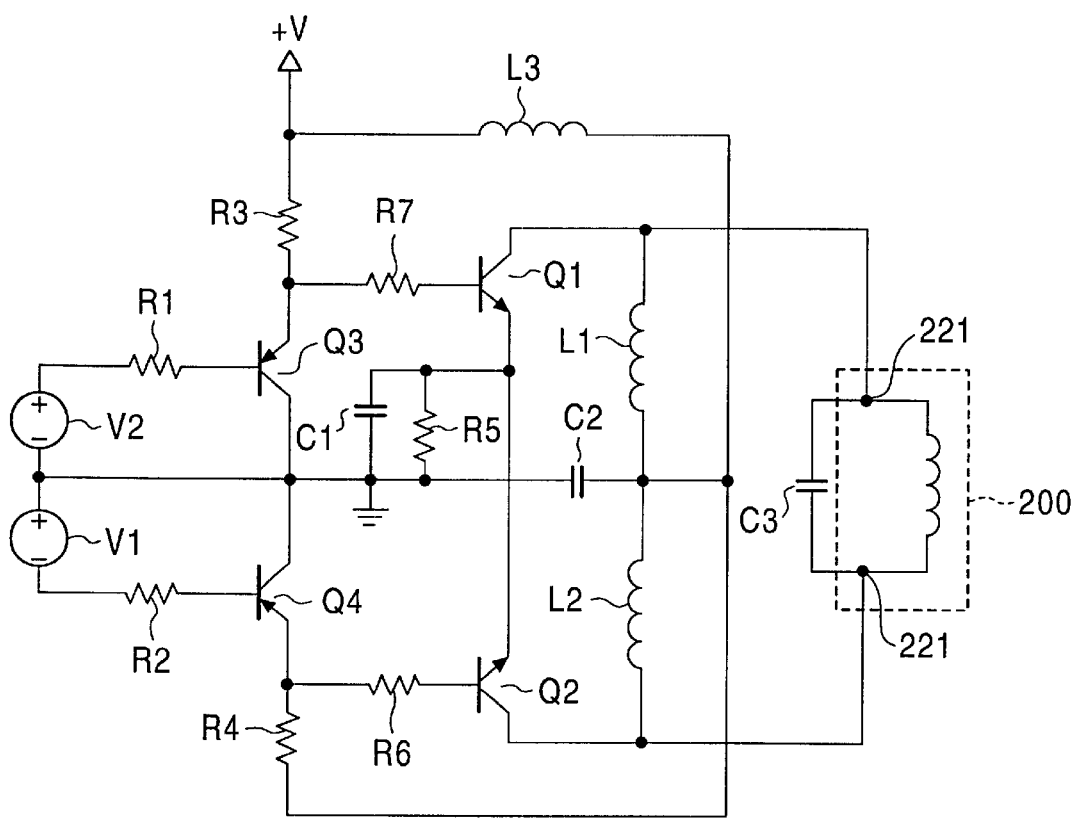
FIG. 17 is a circuit diagram of a communication apparatus in electromagnetic coupling non-contact communication using the printed circuit board of FIG. 2.

As in the transmission circuit described with reference to FIG. 17, in the transmission circuit of FIG. 20, normal and reverse phase drive signals are transmitted by a signal source V1 and a signal source V2. These signals are supplied to the base of a PNP transistor Q3 or a PNP transistor Q4 through a resistor R1 or a resistor R2 and amplified. Then, they are output from an emitter to which DC bias voltage is applied through a resistor R3 or a resistor R4. This output signal is input to the base of a PNP transistor Q9 or a PNP transistor Q10 through a resistor R12 or a resistor R11, and amplified in power. The power-amplified signal is resonated at a predetermined communication frequency determined by a coil (antenna) formed by a capacitor C3 and the printed circuit board 240.

To the tap 242 of the printed circuit board 240, there is applied a DC voltage whose AC component is suppressed by the choke coil L3 and smoothed by the capacitor C2. On the basis of this voltage, a bias current flows through the route: the tap 242, the tap 241, the collector-emitter of the NPN transistor Q9, and the resistor R5, or the route: the tap 242, the tap 243, the collector-emitter of the NPN transistor Q10, and the resistor R5. The capacitor C1 is used for the bypassing purpose.

In the transmission circuit described with reference to FIG. 17, DC voltage is supplied to the transistor Q1 and the transistor Q2, so that it is necessary to provide external choke coils L1 and L2, and, due to the variation thereof, it is difficult to supply a stable bias voltage. In the transmission circuit shown in FIG. 20, it is possible to supply power source by the tap 202, which can serve as a correct electrical middle point, so that it is possible to omit the choke coils L1 and L2, whereby it is possible to reduce the number of parts, and reduce the circuit scale, and, at the same time, supply a stable bias voltage.

Figure 21A:
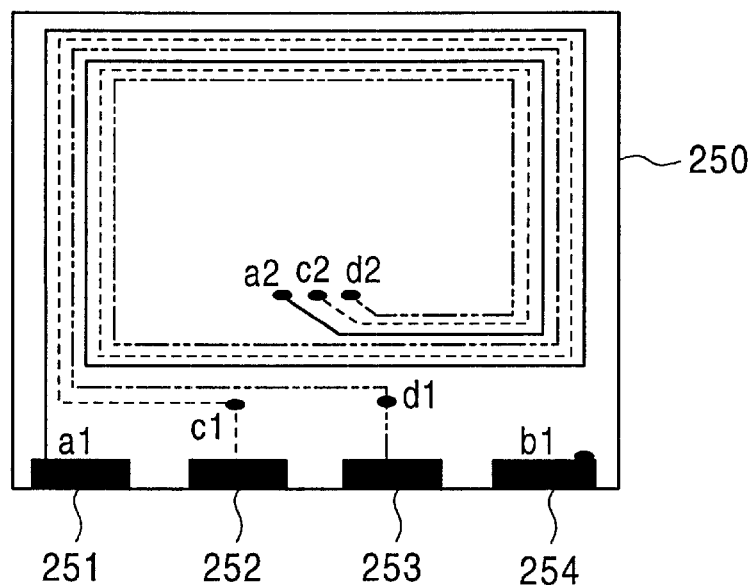
FIG. 21, consisting of FIGS. 21A and 21B, is a diagram showing a second embodiment of a printed circuit board to which the present invention is applied.
Figure 21B:
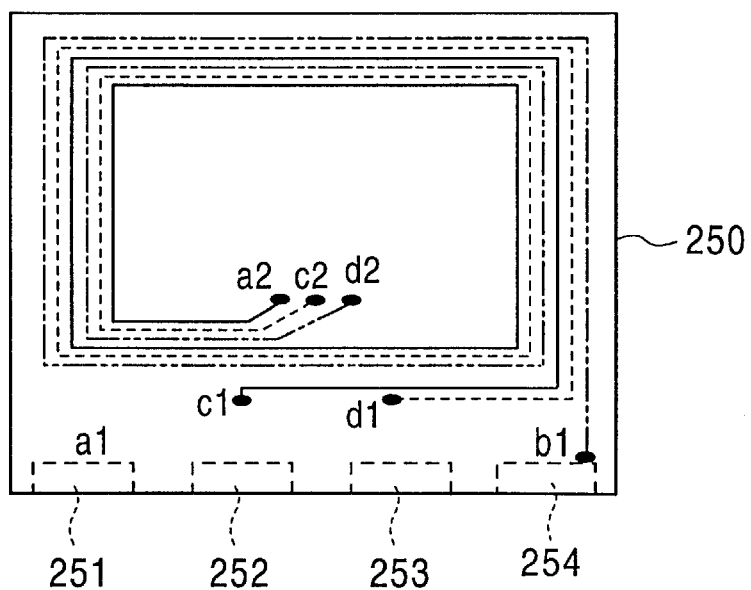

Next, FIG. 21 shows the second embodiment of the printed circuit board to which the present invention is applied. Like the printed circuit board 240, the printed circuit board 250 is a two-layer substrate; FIG. 21(A) is a pattern diagram of side A of the printed circuit board 250; and FIG. 21(B) is a perspective pattern diagram of side B as seen from side A.

In the printed circuit board 250, two sets of spiral patterns, three on side A and three on side B, are concentrically developed. The spiral pattern (the solid line pattern of FIG. 21(A) extending toward the center from a terminal a1 connected to a tap 251 is connected to side B through a through-hole a2, and, from the through-hole a2, a spiral pattern extending toward the outer periphery (the solid line pattern of FIG. 21(B)) is developed toward a through-hole c1 connected to a tap 52. This pattern is connected to side A through the through-hole c1, and the spiral pattern (the dotted line pattern of FIG. 21(A)) extending from the through-hole c1 toward the center is connected to side B through a through-hole c2, and, from the through-hole c2, the spiral pattern extending toward the outer periphery (the dotted line pattern of FIG. 21(B)) is developed toward a through-hole d1 connected to a tap 253. This pattern is connected to side A through a through-hole b1, and the spiral pattern extending from a through-hole d1 toward the center (the two-dot-chain-line pattern of FIG. 21(A)) is connected to side B through a through-hole d2, and, from the through-hole d2, the spiral pattern extending toward the outer periphery (the two-dot-chain-line pattern of FIG. 21(B)) is developed toward the through-hole b1 connected to a tap 254.

Figure 22:
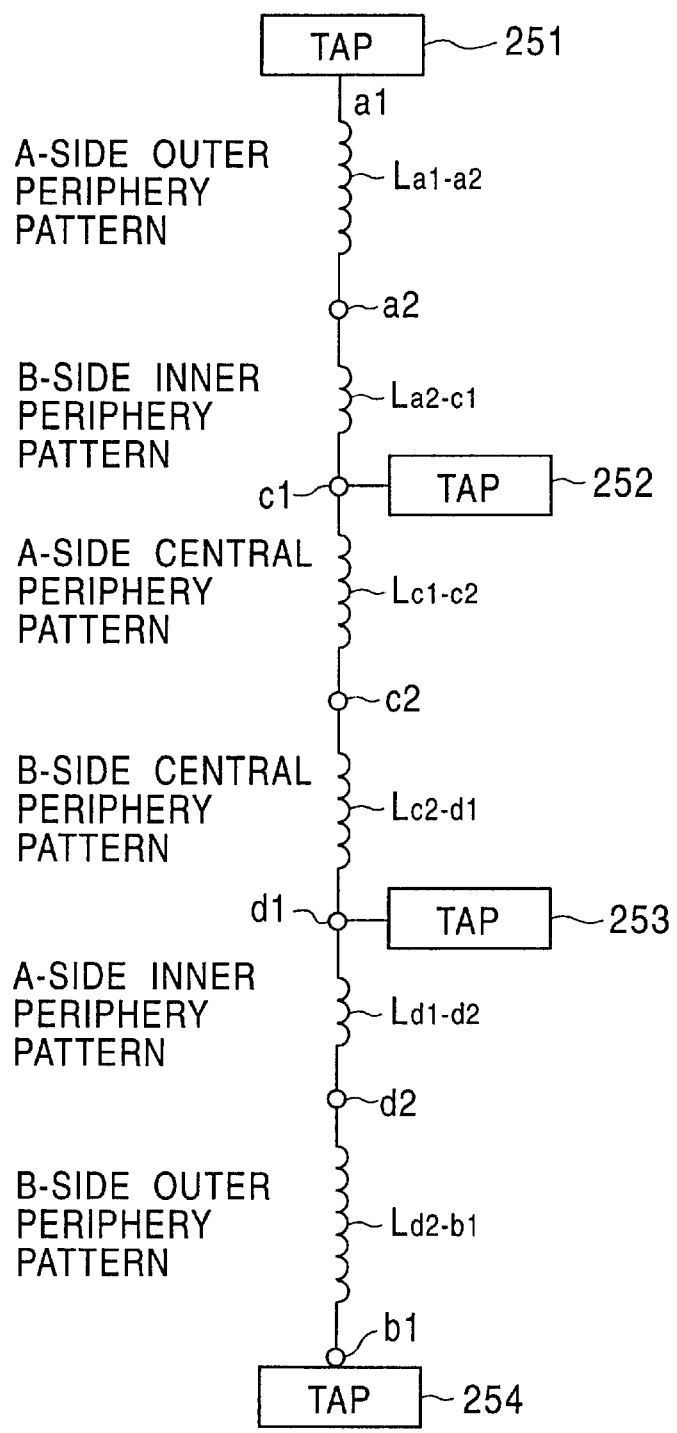
FIG. 22 is a diagram illustrating the position of a coil and an intermediate tap formed on the printed circuit board of FIG. 21.

The patterns of sides A and B of the printed circuit board 250, in plane view, are as shown in FIG. 22. That is, in FIG. 21(A), the pattern indicated by the solid line corresponds to the coil La1-a2 of FIG. 22; In FIG. 21(A), the pattern indicated by the dotted line corresponds to the coil Lc1-c2 of FIG. 22; in 8(A), the pattern indicated by the two-dot chain line corresponds to the coil Ld1-d2 of FIG. 22; in FIG. 21(B), the pattern indicated by the solid line corresponds to the coil La2-c1 of FIG. 22; in FIG. 21(B), the pattern indicated by the dotted line corresponds to the coil Lc2-d1 of FIG. 22; and, in FIG. 21(B), the pattern indicated by the two-dot chain line corresponds to the coil Ld2-b1 of FIG. 22.

Here, for the tap 252 and the tap 253, which are intermediate taps, to be exactly points effecting electrical division into three equal parts with respect to the tap 251 and the tap 254, the central pattern should have exactly a middle length with respect to the lengths of the outer periphery and inner periphery patterns (½ of the sum total of the length of the outer periphery coil and the length of the inner periphery coil). And, a combination is effected such that the inter-tap coil lengths are substantially the same. That is, as shown in FIG. 22, in the portion from the tap 251 to the tap 252 and the portion from the tap 253 to the tap 254, the inner periphery and outer periphery patterns are combined, and, in the portion from the tap 252 to the tap 253, the central pattern is combined. As a result, the tap 252 and the tap 253 are exactly points effecting electrical division into three equal parts with respect to the tap 251 and the tap 254.

Similarly, by increasing the number of patterns developed on the same surface of the printed circuit board, it is possible to provide three or more intermediate taps on the coil formed in the pattern on the printed circuit board.

FIG. 23 shows the third embodiment to which the present invention is applied. For example, in uses other than antennas, in a case in which there is no need to mount an intermediate tap on the coil formed on the printed circuit board, it is possible to apply the present invention to improve the inductance of the coil formed on the printed circuit board without increasing the substrate area and the number of substrates.

Figure 23A:
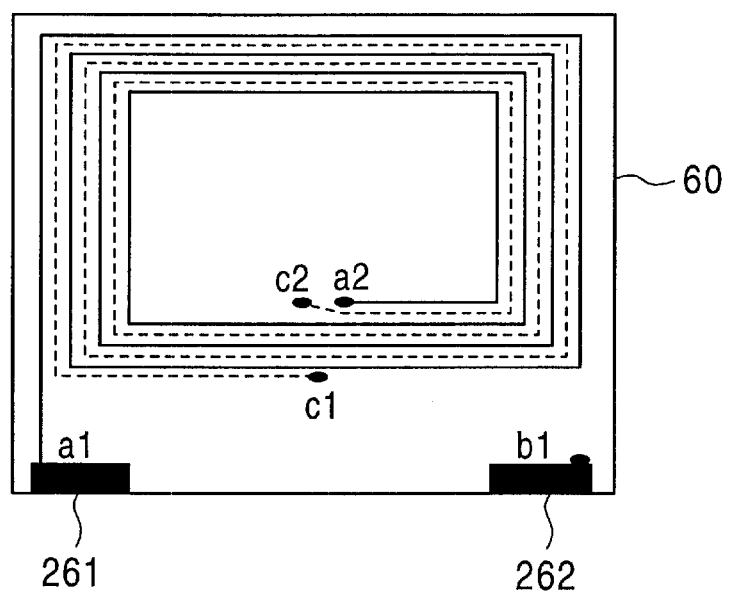
FIG. 23, consisting of FIGS. 23A and 23B is a diagram showing a third embodiment of a printed circuit board to which the present invention is applied.
Figure 23B:
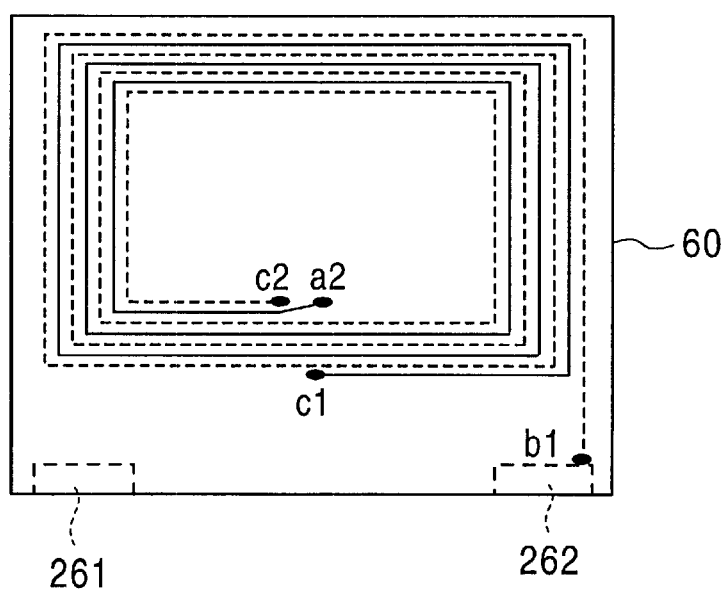
Figure 24:
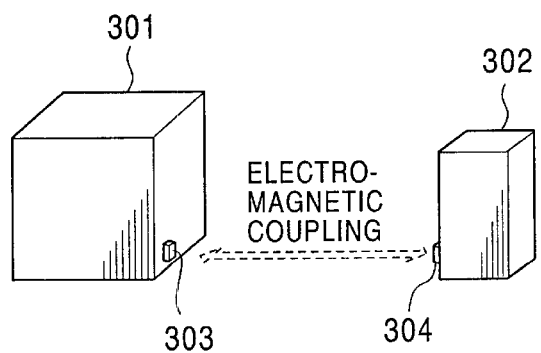
FIG. 24 is a diagram illustrating a communication apparatus performing electromagnetic coupling non-contact communication.
Figure 25:
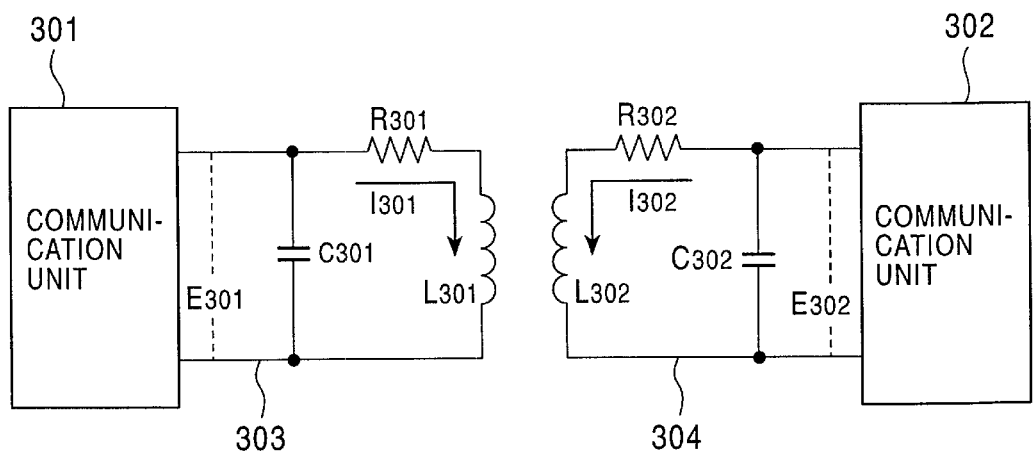
FIG. 25 is a diagram illustrating the circuit of the antenna of a relevant communication apparatus performing electromagnetic coupling non-contact communication.
Figure 26:
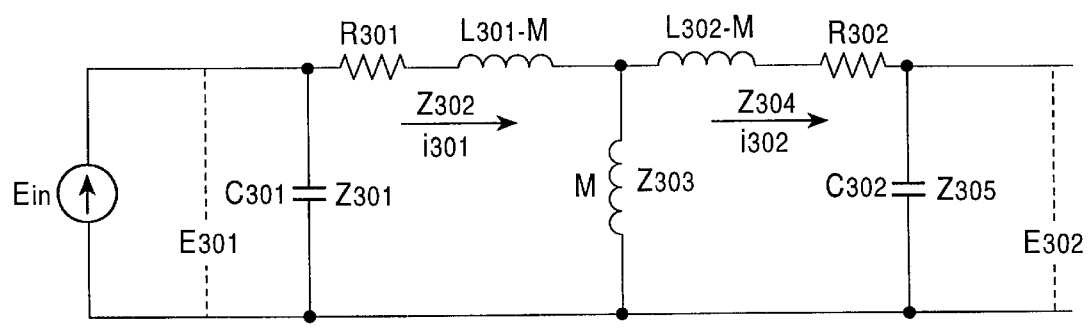
FIG. 26 is a diagram showing equivalent circuits of the antenna 303 and the antenna 304 of FIG. 25.
Figure 27:
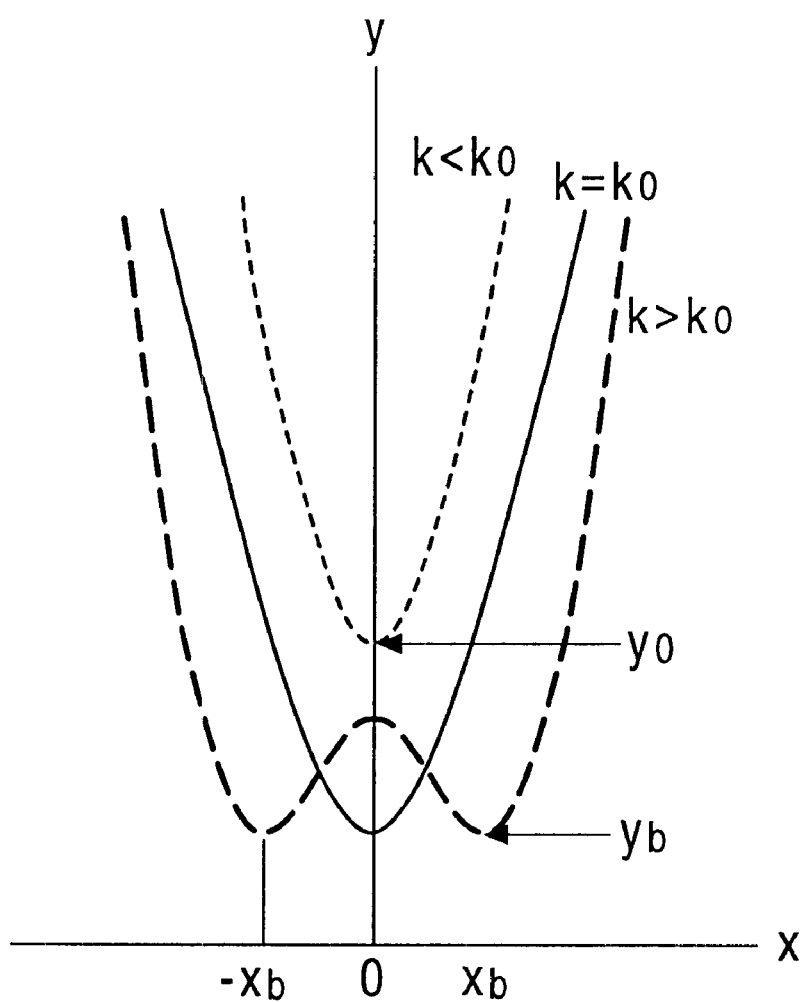
FIG. 27 is a diagram showing the relationship between the coupling coefficient k and the transfer frequency characteristic y.
Figure 28:
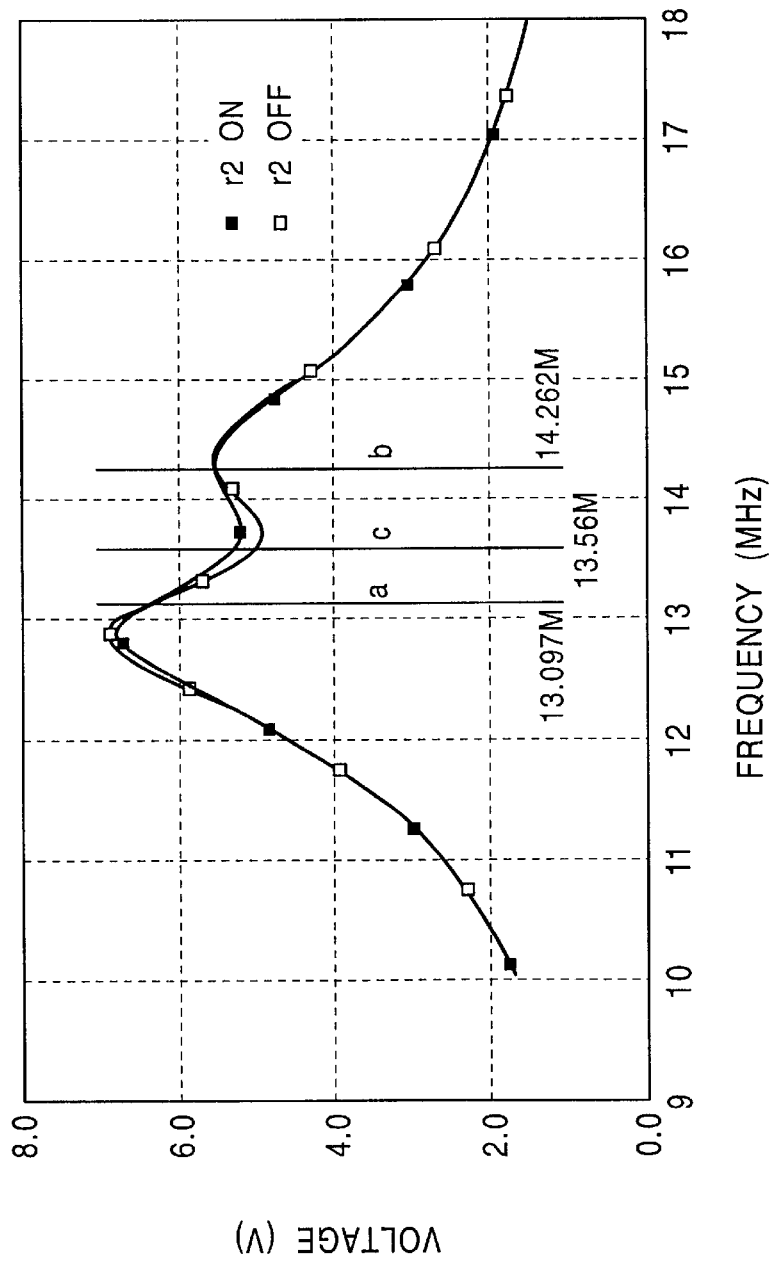
FIG. 28 is a diagram showing the relationship between the output voltage and the communication frequency.

FIG. 23(A) is a pattern diagram of side A of a printed circuit board 260, and FIG. 23(B) is a perspective pattern diagram of side B of the printed circuit board 260 as seen from side A. The printed circuit board 260 is a two-layer substrate, and the pattern wiring is substantially the same as that of the printed circuit board 240 described with reference to FIG. 18, only the tap 261 and the tap 262 being mounted, with no intermediate tap being provided. While here two patterns are developed on the same surface, it is also possible to develop three or more patterns on the same surface, thereby further improving the coil inductance.

Figure 30:
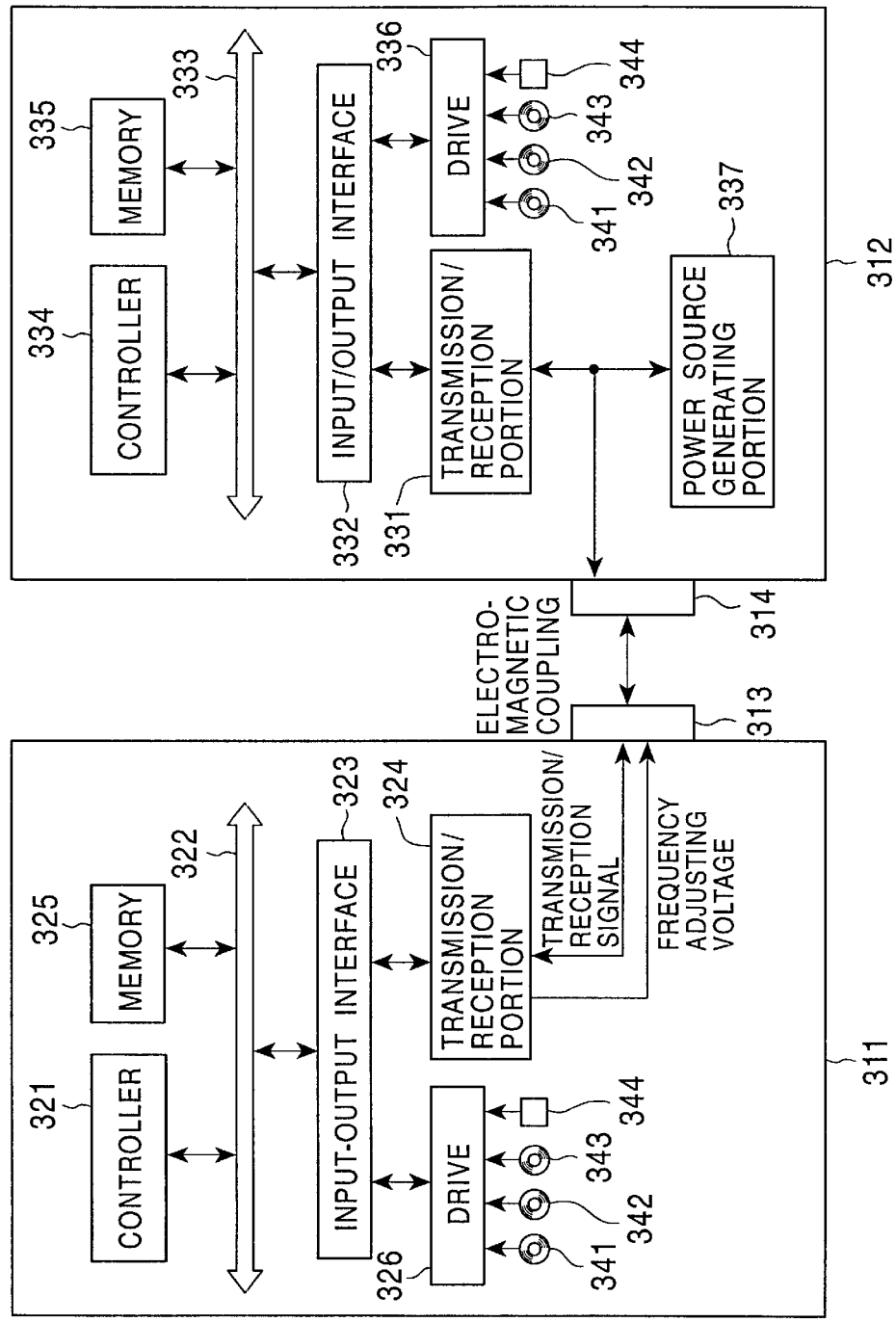
FIG. 30 is a block diagram showing a communication apparatus to which the present invention is applied.

FIG. 30 is a block diagram showing the construction of a communication apparatus 311 and a communication apparatus 312 to which the present invention is applied. Here, a communication apparatus is a general apparatus for transmitting and receiving information by non-contact communication, meaning, for example, a VTR, a cassette, a mobile phone, a card, a CAM, etc.

A controller 321 of the communication apparatus 321 generates a read command requiring data transmission of a predetermined block of the data the reception side communication apparatus reserves (for example, data reserved in memory 335 of the communication apparatus 312), and supplies it to a transmission/reception portion 324 through an inner bus 322 and an input/output interface 23. The transmission/reception portion varies the circuit current value of an antenna 313, whereby it controls (ASK) the amplification modulation of the supplied data, transmitting the read command from the antenna 313 to the communication apparatus 312.

And, when the communication apparatus 312 receives the read command and receives the relevant read response (that is, a predetermined block data reserved in the memory 335 of the communication apparatus 312) through the antenna 313, the transmission/reception portion 324, the input/output interface 323, and the inner bus 322, the controller 321 decides that the communication is being normally conducted, and executes data communication. When the read response with respect to the read command is not received, the controller 321 outputs a control signal for changing the resonance frequency of the antenna 313 through the inner bus 322 and the input/output interface 323 to the transmission/reception portion 324. Upon the input of the control signal from the controller 321, the transmission/ reception portion 324 changes the resonance frequency adjusting voltage of the antenna 313 to change the resonance frequency (change the resonance capacitance) of the antenna 313.

Figure 29A:
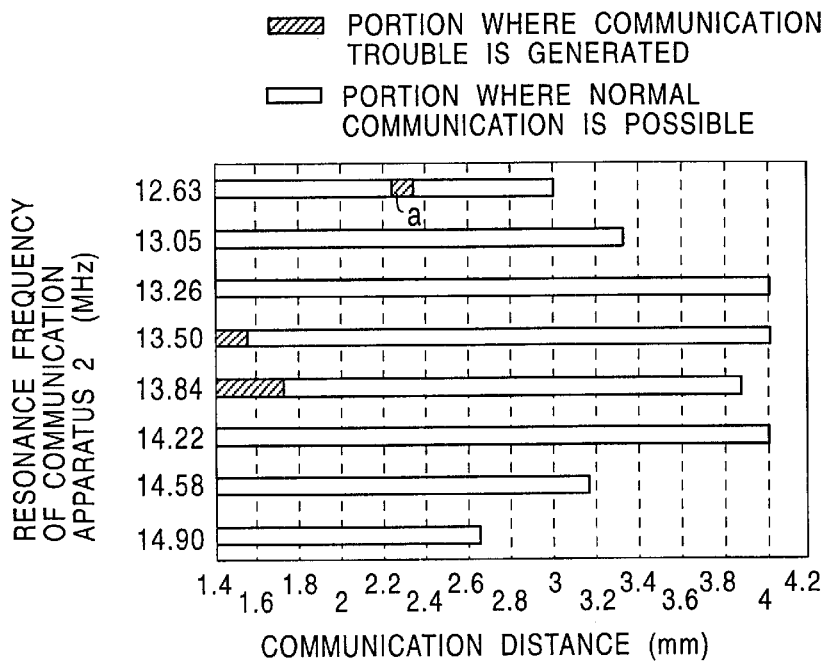
FIG. 29, consisting of FIGS. 29A and 29B is a diagram showing the influence of variation in communication distance and reception side resonance frequency in relevant electromagnetic coupling non-contact communication.
Figure 29B:
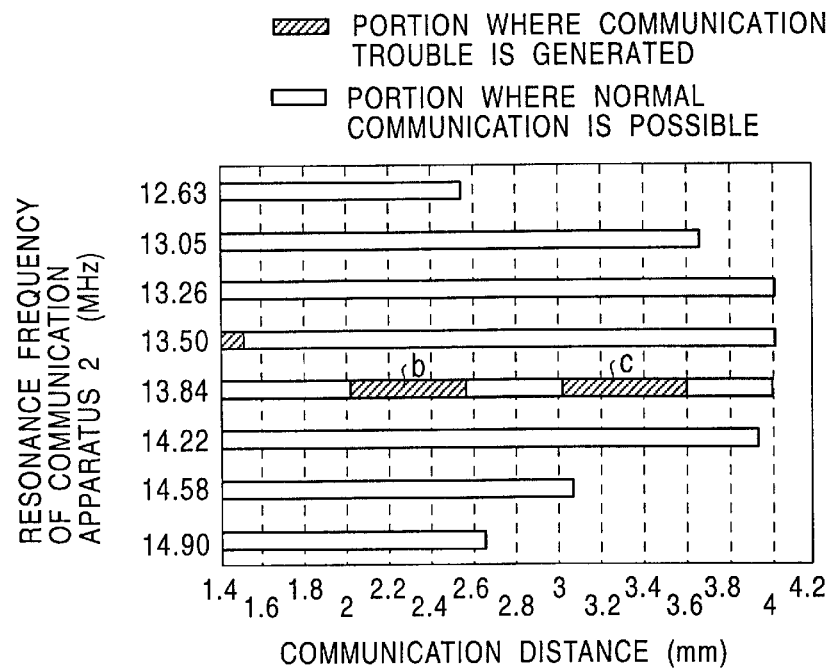

As described with reference to FIG. 29, the modulation null point at a certain resonance frequency and the modulation null point at a resonance frequency in the proximity thereto are generated in different inter-apparatus distances at different resonance frequencies of the reception side apparatus. Thus, by changing the resonance frequency of the transmission side apparatus in accordance with the resonance frequency on the reception side and the inter-apparatus distance, it is possible to eliminate the communication trouble due to the modulation null point. In the communication apparatus 311, it is possible to set one or a plurality of sub-frequency (sub-tune), which is a value obtained by offsetting the frequency by approximately 500 KHz to 2 MHz with respect to the main resonance frequency (main tune) (that is, it is possible to previously set several values of the resonance frequency adjusting voltage supplied to the antenna 313), and, while checking the state of communication with the reception side apparatus in accordance with the processing described below with reference to FIG. 33, it is possible to sequentially switch the resonance frequency (searching). Here, this arrangement in which a stable communication can be obtained by changing the tune will be referred to as tune diversity.

Further, the controller 321 reads data from, for example, the magnetic disk inserted into the drive 326, the optical disk 342, the magneto-optical disk 343, the semiconductor memory 344, etc. and reserves it in the memory 325 through the input/output interface 323, or reads the data reserved in the memory 325, and supplies it to the transmission/reception portion 324 through the inner bus 322 and the input/output interface 323. The transmission/reception portion 324 changes the circuit current value of the antenna to thereby control the amplification modulation of the supplied data, and transmits the data from the antenna 313 to the communication apparatus 312.

Further, the information transmitted from the communication apparatus 312 is received by the antenna 313, modulated by the transmission/reception portion 324, and input to the controller 321 through the input/output interface 323 and the inner bus 322. The controller 321 causes the input data to be reserved in the memory 325, or, when the input data is the read response, it decides that the communication is being normally conducted.

In the communication apparatus 312, the data transmitted from the communication apparatus 311 is received by the antenna 314, modulated by the transmission/reception portion 331, and supplied to the controller 334 through the input/output interface 332 and the inner bus 333. The controller 334 executes a processing according to the supplied data, and, as needed, causes the supplied data or the data generated by the executed processing to be reserved in the memory 335. In the memory 335, predetermined data used to check the transmission/reception condition with respect to the communication apparatus 311 is reserved.

For example, when the read command is received from the communication apparatus 311, the controller 334 receives the data reserved in a predetermined block of the memory 335, and supplies it to the transmission/reception portion 331 through the inner bus 333 and the input/output interface 332. The transmission/reception portion 331 switches ON/OFF the resistor R12 of the antenna 314 described below with reference to FIG. 32 in accordance with the supplied data, whereby it controls the amplification modulation of the supplied data (ASK), and transmits the data from the antenna 314 to the communication apparatus 311.

Further, the drive 336 is also connected to the input/output interface 332, and the controller 334 performs interchange of data, for example, with the magnetic disk 341 inserted into the drive 336, the optical disk 342, the magneto-optical disk 343, and the semiconductor memory 344.

The power source generating portion 337 generates the power source necessary for the operation of the communication apparatus 312 by rectifying the received signal, and supplies it to each portion of the communication apparatus 312.

Figure 31B:
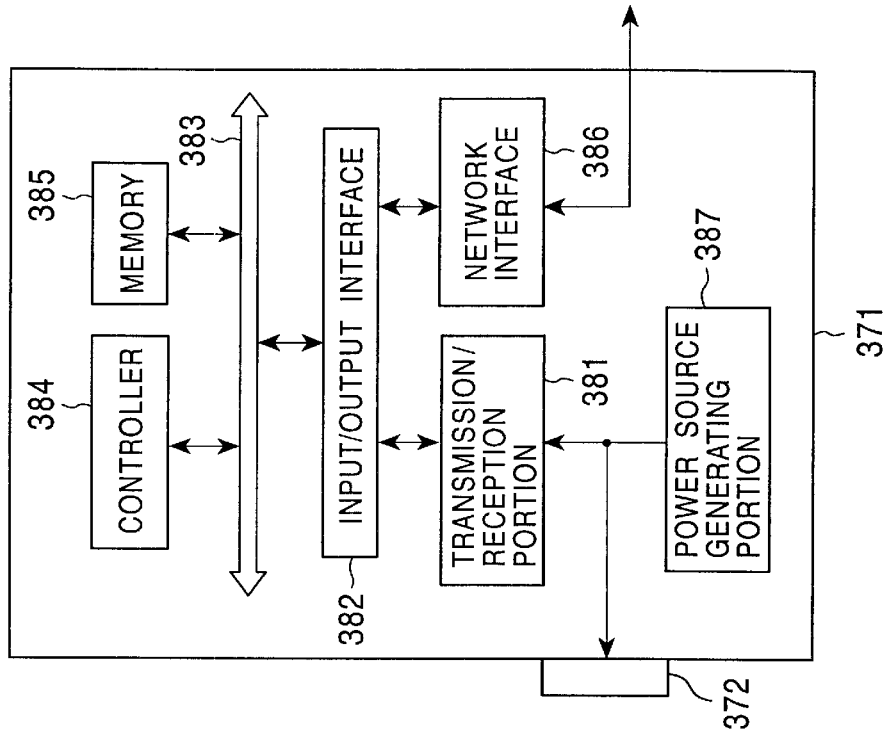
FIG. 31 is a block diagram showing a communication apparatus to which the present invention is applied.
Figure 31A:
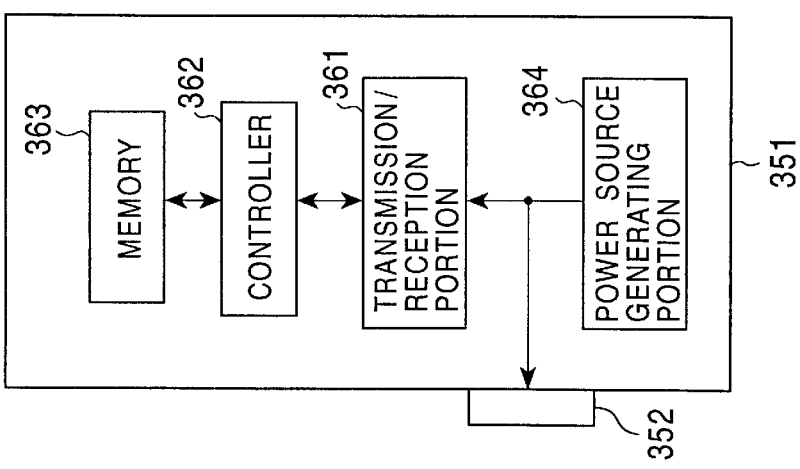

When the reception side apparatus is a very small communication apparatus such as a card, a construction may be adopted which is not provided with a drive or an input/output interface as in the case of the communication apparatus 351 shown in FIG. 31(A). The antenna 352 and the transmission/reception portion 361 or the power source generating portion 364 of the communication apparatus 351 execute the same processing as the antenna 314, the transmission/reception portion 331, the controller 334, the memory 335, and the power source generating portion 337 of the communication apparatus 312 described with reference to FIG. 30, so that a description thereof will be omitted here.

Further, when the reception side communication apparatus is a communication apparatus of the size, for example, of a mobile phone, it is difficult to provide a built-in drive, etc., so that, as in the case of the communication apparatus 371 shown in FIG. 31(B), it is possible to adopt a construction in which an external device such as a drive can be externally connected by providing a network interface 386. The construction of the communication apparatus 71 is the same as that of the communication apparatus 312 described with reference to FIG. 30 except that the network interface 386 is provided instead of the drive 336 of the communication apparatus 312, so that a description thereof will be omitted here.

Figure 32:
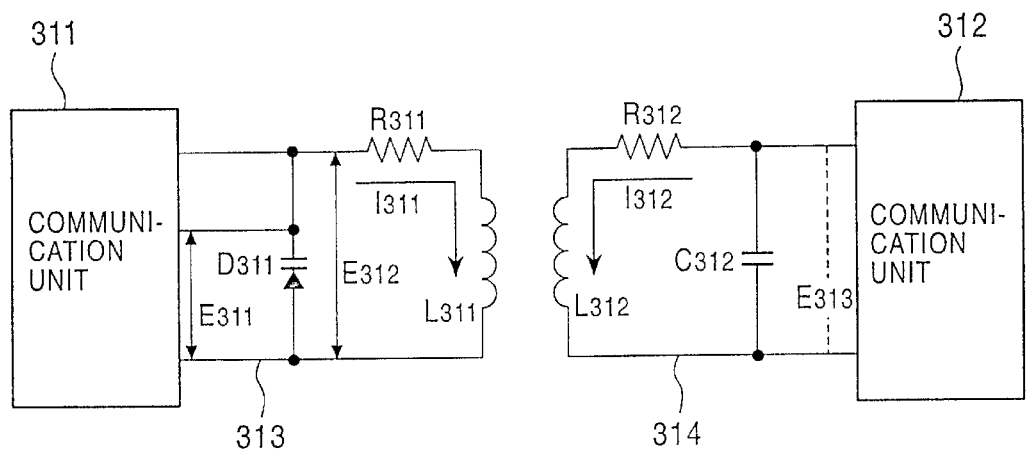
FIG. 32 is a diagram illustrating the circuit of the antenna of a communication apparatus to which the present invention is applied.

FIG. 32 shows in detail the construction of the antenna 313 and the antenna 314 of the communication apparatus 311 and the communication apparatus 312. The antenna 313 and the antenna 314 are basically of the same construction as the case described with reference to FIG. 32 except that, to make it possible to change the resonance frequency of the antenna 313, a variable capacitance diode (varicap) D11 is used instead of the capacitor C1 of the antenna 303, and that an input for changing the application voltage E11 of the variable capacitance diode D11 is added to the cathode side of the variable capacitance diode D11. A variable capacitance diode is an element which has a characteristic such that when a reverse direction bias is applied, the capacitance between anode and cathode varies according to the voltage value. The transmission/reception portion 324 of the communication apparatus 311 changes the resonance frequency of the antenna 313 by controlling the capacitance thereof by varying the voltage E11 applied to the variable capacitance diode D11 in the processing described below with reference to FIG. 33.

Figure 33:
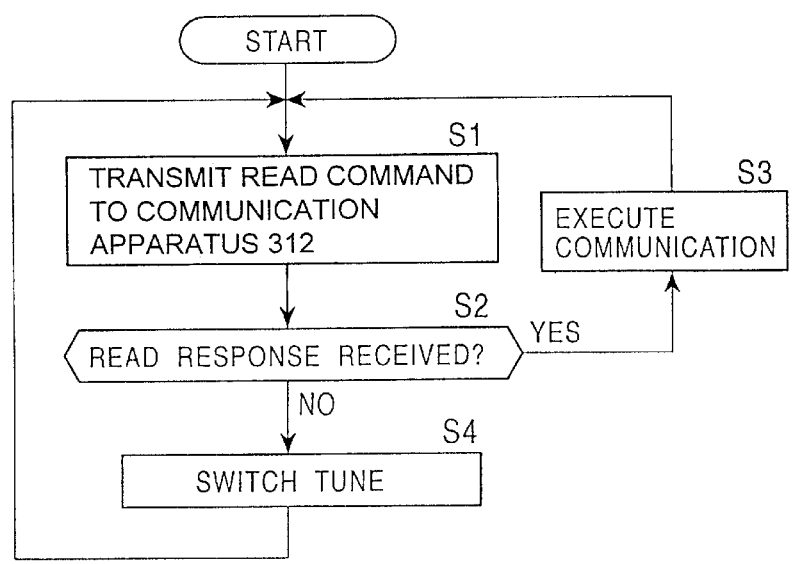
FIG. 33 is a flowchart illustrating the processing of switching the tune of an antenna.

Next, with reference to the flowchart of FIG. 33, the searching processing of the antenna diversity of the communication apparatus 311 will be described.

In step S1, the controller 321 transmits to the communication apparatus 312 a read command, which is a signal instructing to read the data of a predetermined block reserved in the memory 335 of the communication apparatus 312 and return it to the communication apparatus 311, through the inner bus 322, the input/output interface 323, the transmission/reception portion 324, and the antenna 313. When the antenna 314 of the communication apparatus 312 can receive this read command, the received the signal is supplied to the controller 334 through the transmission/reception portion 331, the input/output interface 332, and the inner bus 333, and the controller 334 reads the data from the designated block of the memory 335 in accordance with the read command, and transmits the data to the communication apparatus 311 as the read response through the inner bus 333, the input/output interface 332, the transmission/reception portion 331, and the antenna 314. When the antenna 314 cannot receive the read command, the read response is not transmitted from the communication apparatus 312 to the communication apparatus 311.

In step S2, the controller 321 makes a judgment as to whether the read response has been received or not on the basis of the data input through the antenna 313, the transmission/reception portion 324, the input/output interface 323, and the inner bus 322. When it is decided in step S2 that the read response has been received, the controller 321 decides in step S3 that the communication with the communication apparatus 312 is possible, and executes the communication of data. And, the procedure returns to step S1, and the processing from that on is repeated.

When it is decided in step S2 that the read response has not been received, the controller 321 generates in step S4 a control signal for changing the resonance frequency of the antenna 313 to a resonance frequency other than the current resonance frequency, and outputs it to the transmission/reception portion 324 through the inner bus 322 and the input/output interface 323. When, for example, two resonance frequencies of main tune and sub-tune are previously prepared in the communication apparatus 311, this control signal instructs to change the resonance frequency to sub-tune if the communication is being performed in main tune, and to change the resonance frequency to main tune if the communication is being performed in sub-tune. The transmission/reception portion 324 changes the resonance frequency of the antenna 313 by changing the value of the voltage for adjusting the resonance frequency applied to the variable capacitance diode D11 of the antenna 313 in accordance with the input control signal. And, the procedure returns to step S1, and the processing from that onward is repeated.

Figure 34:
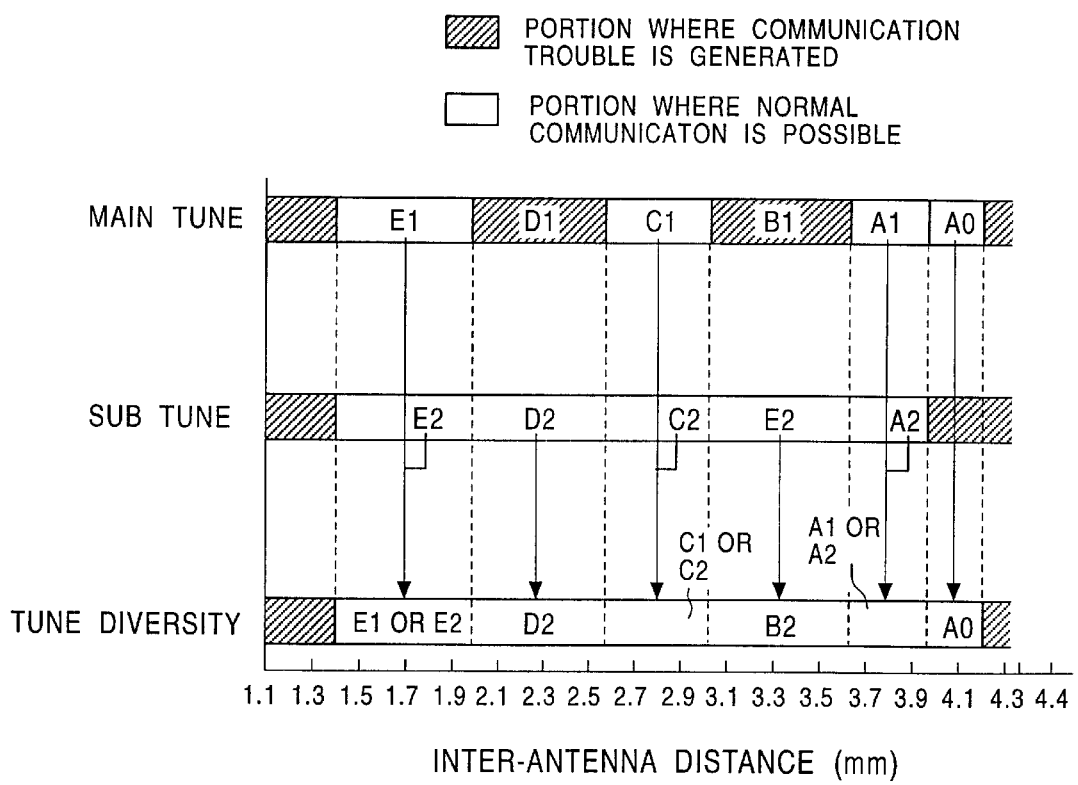
FIG. 34 is a diagram illustrating inter-antenna distance and tune switching.

Here, to illustrate the processing of changing the resonance frequency by tune diversity, a case will be considered with reference to FIG. 34 in which the distance between the antenna 313 of the communication apparatus 311 and the antenna 314 of the communication apparatus 312 varies.

For example, a case will be considered in which the inter-antenna distance is gradually decreased from the condition in which the inter-antenna distance is not less than 5 mm and in which it is decided that communication trouble is generated in both main tune and sub-tune. Here, in the communication apparatus 311, two resonance frequencies of main tune and sub-tune are set, the main tune being set somewhat higher than the communication frequency in order to improve the practical communication distance, the sub-tune being set at a frequency higher than the main tune approximately by 500 kHz in order to compensate for the communication trouble due to the modulation null point in the main tune.

When the inter-antenna distance is not less than 4.2 mm, it is decided that communication trouble has been generated, so that the communication apparatus 311 executes searching. When the inter-antenna distance is gradually reduced to attain 4.2 mm, the main tune is a more advantageous frequency in communication distance, so that in the inter-antenna distance indicated by AO in the drawing, it is possible to execute communication in main tune.

When the inter-apparatus distance is further reduced to attain 3.6 mm, the modulation null point is reached at the frequency of the current main tune, and communication trouble is generated. That is, if the communication apparatus 311 transmits the read command, the communication apparatus 312 does not return the read response. The controller 321 outputs to the transmission/reception portion 324 a control signal for changing the resonance frequency to sub-tune, and the transmission/reception portion 324 causes the value of the voltage applied to the variable capacitance diode D11 to be changed, adjusts the resonance frequency to sub-tune, and transmits the read command to the communication apparatus 312. In sub-tune, normal communication is possible (as indicated at B2 in the drawing) even when the inter-antenna distance is 3.0 to 3.6 mm, so that the communication apparatus 312, having received the read command, returns the read response to the communication apparatus 311. And, the communication apparatus 311 and the communication apparatus 312 start normal communication. After this also, when communication trouble is generated through change in inter-antenna distance, the controller 321 executes tune by controlling the value of the voltage applied to the variable capacitance diode D11, always maintaining a condition in which communication is possible.

In this way, also in the case in which the communication condition varies with a change in the inter-antenna distance, the communication apparatus 311 automatically selects and sets a resonance frequency at which communication is possible, whereby it is possible to maintain a satisfactory communication state without the user having to perform tuning operation or adjustment.

Figure 35:
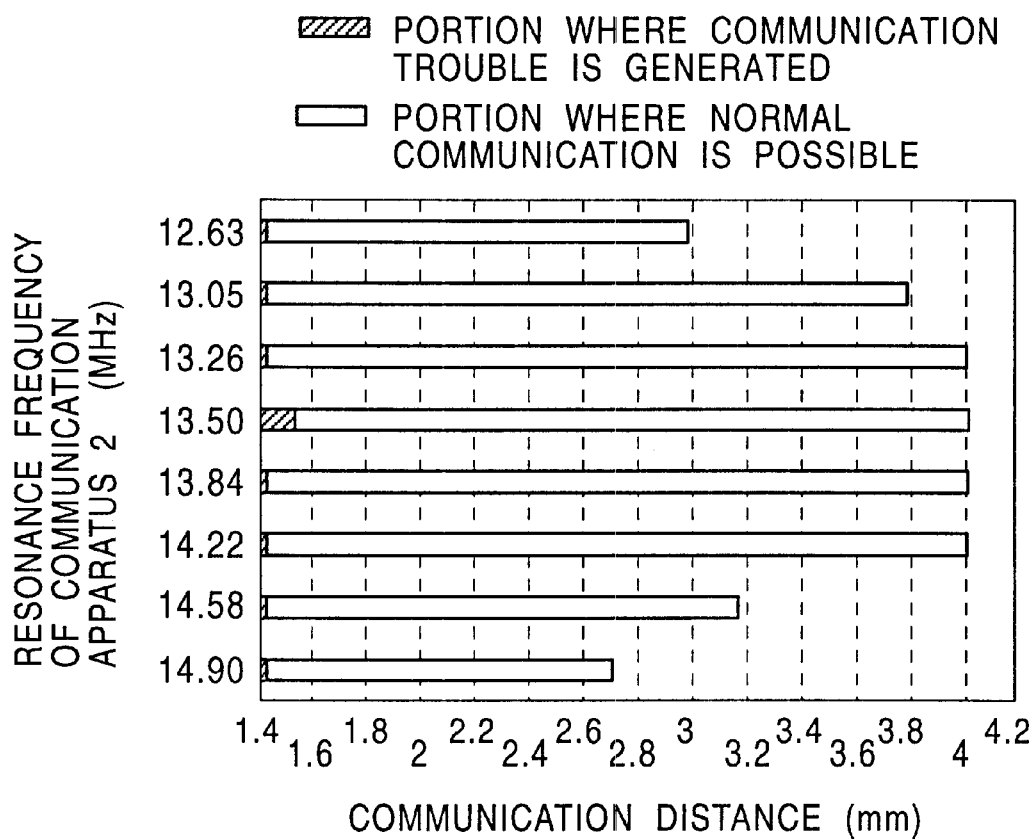
FIG. 35 is a diagram showing the influence of variation in communication distance and reception side resonance frequency in electromagnetic coupling non-contact communication to which the present invention is applied.

FIG. 35 shows the practical communication distance examination results in a case in which a variation is effected in the antenna resonance frequency of the antenna 314 of the communication apparatus 312, executing tune diversity with the antenna resonance frequency of the antenna 313 of the communication apparatus 311 being the main tune of 13.56 MHz, which is the communication frequency, and the sub-tune of 14.1 MHz.

For example, when the normal communication cannot be conducted at the resonance frequency of 13.56 MHz, which is the main tune, (that is, when, in the case described above with reference to FIG. 29(A), communication trouble indicated at a is generated), the resonance frequency is changed to 14.1 MHz by tune diversity, and when the normal communication cannot be conducted at the resonance frequency of 14.1 MHz, which is the sub-tune, (that is, when, in the case described above with reference to FIG. 29(B), communication trouble indicated at b and c is generated), the resonance frequency is changed to 13.56 MHz by tune diversity. In other words, it can be seen that the examination result shown in FIG. 35, in which tune diversity is used, is equal to what is obtained by synthesizing the portions of the examination results shown in FIGS. 29(A) and 29(B) in which communication is possible.

As can be seen from FIG. 35, in the communication apparatus to which the present invention is applied, by using tune diversity, the communication trouble at the modulation null point is eliminated, making it possible to execute highly reliable communication without performing adjustment.

The software for executing the above series of processing is installed from a recording medium to a computer in which the program constituting the software is incorporated in the dedicated hardware (for example, the controller 321 and the controller 334 of FIG. 30), or, for example, to a general-purpose personal computer capable of executing various functions by installing various programs.

As shown in FIG. 30, this recording medium is composed of a package media including the magnetic disk 341 (including the floppy disk) on which the program is recorded, the optical disk 342 (including CD-ROM (compact disk-read only memory), DVD (digital versatile disk)), and the magneto-optical disk 343 (including MD (mini-disk), or a package media consisting of the semiconductor memory 344 or the like, distributed for the purpose of providing the user with a program apart from the computer.

Further, in this specification, the steps describing the program recorded on the recording medium include not only the processing conducted in time sequence according to the order described, but also the processing which, if not processed in time sequence, is executed in parallel processing or individually.

As is apparent from the above description, in accordance with the present invention, there is provided a recording/playback apparatus which accommodates in a cassette shell a recording medium and which performs recording and/or playback with respect to the recording medium cassette provided with a cassette-side antenna connected to an in-cassette memory recording information regarding recording contents or the like, the apparatus comprising a recording/playback mechanism portion performing recording and/or playback with respect to a recording medium cassette, a cassette holding member which holds the recording medium cassette, which moves between a recording/playback position near the recording/playback apparatus where recording and/or playback is conducted with respect to the recording medium cassette and a cassette passing position spaced apart from the recording/playback mechanism portion where the passing of the recording medium cassette is effected, and at least the portion of which opposed to the cassette-side antenna is formed of a metal, a cassette passing member which moves between a holding position where the recording medium cassette is held by the cassette holding member and an eject position where the recording medium cassette is inserted and detached in a direction crossing the movement path of the cassette holding member, and an apparatus side antenna for effecting communication through the in-cassette memory and the cassette-side antenna, wherein an electric wave transmission portion is formed in the portion of the cassette holding member opposed to the cassette-side antenna, and wherein the apparatus-side antenna is arranged in correspondence with the electric wave transmission portion.

Thus, in the recording/playback apparatus of the present invention, the communication between the cassette side antenna and the apparatus-side antenna is conducted efficiently. Further, the cassette holding member can be formed by using a metal, so that it is possible to achieve a reduction in the size of the recording/playback apparatus.

In the printed circuit board of the present invention, a plurality of patterns forming coils are concentrically developed on one and the other side of the printed circuit board, so that, in a printed circuit board whose number of layers is small, for example, a two-layer substrate, it is possible to achieve an improvement in reactance and provide an intermediate tap.

In the communication apparatus, the communication method, and the recording medium program of the present invention, the resonance frequency of the antenna is set, the transmission/reception state is detected, and the resonance frequency of the antenna is changed in accordance with the detection result, so that the transmission/reception state is checked, and, in accordance with the checking result, an appropriate resonance frequency is selected from a plurality of resonance frequencies, and switched automatically, whereby it is possible to realize a reliable non-contact communication without performing adjustment.

In the communication apparatus, the communication method, and the recording medium program of the present invention, the data used to detect the transmission/reception state in the communication with the other communication apparatus is reserved, and when the requirement to transmit data is received from the other communication apparatus to detect the communication state, the data is transmitted to the other communication apparatus, so that it is possible to cause the other communication apparatus in the data communication to check the transmission/reception state, making it possible to realize a reliable non-contact communication without performing adjustment.

What is claimed is:

1. A recording/playback apparatus which accommodates in a cassette shell a recording medium and which performs recording and/or playback with respect to the recording medium cassette provided with a cassette-side antenna connected to an in-cassette memory recording information regarding recording contents or the like, the apparatus comprising a recording/playback mechanism portion performing recording and/or playback with respect to a recording medium cassette, a cassette holding member which holds the recording medium cassette, which moves between a recording/playback position near the recording/playback apparatus where recording and/or playback is conducted with respect to the recording medium cassette and a cassette passing position spaced apart from the recording/playback mechanism portion where the passing of the recording medium cassette is effected, and at least the portion of which opposed to the cassette-side antenna is formed of a metal, a cassette passing member which moves between a holding position where the recording medium cassette is held by the cassette holding member and an eject position where the recording medium cassette is inserted and detached in a direction crossing the movement path of the cassette holding member, and an apparatus side antenna for effecting communication through the in-cassette memory and the cassette-side antenna, wherein an electric wave transmission portion is formed in the portion of the cassette holding member opposed to the cassette-side antenna, and wherein the apparatus-side antenna is arranged in correspondence with the electric wave transmission portion.

2. A recording/playback apparatus according to claim 1, wherein the electric wave transmission portion is an opening.

3. A recording/playback apparatus according to claim 2, wherein the opening is covered with an electric wave transmission member consisting of a material transmitting an electric wave.

* * * * *